US012563787B2

(12) United States Patent
Lindemann et al.

(10) Patent No.: US 12,563,787 B2
(45) Date of Patent: *Feb. 24, 2026

(54) ELECTRONIC DEVICES COMPRISING A STACK STRUCTURE, A SOURCE CONTACT, AND A DIELECTRIC MATERIAL

(71) Applicant: Micron Technology, Inc., Boise, ID (US)

(72) Inventors: Michael A. Lindemann, Boise, ID (US); Collin Howder, Boise, ID (US); Yoshiaki Fukuzumi, Kanagawa (JP); Richard J. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,820

(22) Filed: Jan. 24, 2024

(65) Prior Publication Data

US 2024/0162325 A1 May 16, 2024

Related U.S. Application Data

(63) Continuation of application No. 17/158,918, filed on Jan. 26, 2021, now Pat. No. 11,948,992.

(51) Int. Cl.
| | |
|---|---|
| *H10D 30/67* | (2025.01) |
| *H10B 43/27* | (2023.01) |
| *H10B 43/35* | (2023.01) |
| *H10D 30/69* | (2025.01) |

(Continued)

(52) U.S. Cl.
CPC ......... *H10D 30/6737* (2025.01); *H10B 43/27* (2023.02); *H10B 43/35* (2023.02); *H10D 30/6743* (2025.01); *H10D 30/69* (2025.01); *H10D 64/037* (2025.01); *H10D 64/251* (2025.01)

(58) Field of Classification Search
CPC ........... H10D 30/6737; H10D 30/6743; H10D 30/69; H10D 64/037; H10D 64/251; H10B 43/27; H10B 43/35
See application file for complete search history.

(56) References Cited

U.S. PATENT DOCUMENTS

| | | | |
|---|---|---|---|
| 8,519,471 B2 | 8/2013 | Kuk et al. |
| 9,412,821 B2 | 8/2016 | Simsek-Ege et al. |
| 9,741,737 B1 | 8/2017 | Huang et al. |

(Continued)

FOREIGN PATENT DOCUMENTS

| | | |
|---|---|---|
| TW | 202008563 A | 2/2020 |

OTHER PUBLICATIONS

Caillat et al., 3 DNAND GIDL-Assisted Body Biasing for Erase Enabling CMOS under Array, Conference Paper May 2017, https:researchgate.net/publication/317086612, 5 pages.

(Continued)

*Primary Examiner* — Mohammad A Rahman
(74) *Attorney, Agent, or Firm* — TraskBritt

(57) ABSTRACT

Electronic devices comprising a doped dielectric material adjacent to a source contact, tiers of alternating conductive materials and dielectric materials adjacent to the doped dielectric material, and pillars extending through the tiers, the doped dielectric material, and the source contact and into the source stack. Related methods and electronic systems are also disclosed.

20 Claims, 18 Drawing Sheets

(51) Int. Cl.
    *H10D 64/01*         (2025.01)
    *H10D 64/23*         (2025.01)

(56)               References Cited

U.S. PATENT DOCUMENTS

| | | | |
|---|---|---|---|
| 9,825,048 | B2 | 11/2017 | Cernea |
| 9,941,298 | B2 | 4/2018 | Huang et al. |
| 10,134,758 | B2 | 11/2018 | Zhu et al. |
| 10,229,909 | B2 | 3/2019 | Tokumitsu et al. |
| 10,418,379 | B2 | 9/2019 | Huang et al. |
| 10,559,582 | B2 | 2/2020 | Nishikawa et al. |
| 10,608,012 | B2 | 3/2020 | Huang et al. |
| 10,720,445 | B1 * | 7/2020 | Shimizu ................. H10B 43/40 |
| 10,784,273 | B2 | 9/2020 | Howder et al. |
| 11,948,992 | B2 * | 4/2024 | Lindemann ........... H10B 43/35 |
| 2013/0193403 | A1 | 8/2013 | Smythe et al. |
| 2018/0261671 | A1 | 9/2018 | Matsumoto et al. |
| 2018/0366486 | A1 | 12/2018 | Hada et al. |
| 2019/0103410 | A1 | 4/2019 | Daycock et al. |
| 2019/0221577 | A1 | 7/2019 | Lilak et al. |
| 2019/0371816 | A1 | 12/2019 | Huang et al. |
| 2019/0385681 | A1 | 12/2019 | Yun et al. |
| 2020/0066346 | A1 | 2/2020 | Li et al. |
| 2020/0083245 | A1 | 3/2020 | Fayrushin et al. |
| 2020/0105782 | A1 | 4/2020 | Guo et al. |
| 2020/0161325 | A1 | 5/2020 | Clampitt et al. |
| 2020/0227429 | A1 | 7/2020 | Ji et al. |
| 2020/0251479 | A1 | 8/2020 | Sakakibara et al. |
| 2020/0258574 | A1 | 8/2020 | Mcneil |
| 2020/0350168 | A1 | 11/2020 | Kim et al. |
| 2020/0402992 | A1 | 12/2020 | Otsu et al. |
| 2022/0102344 | A1 | 3/2022 | Then et al. |

OTHER PUBLICATIONS

Chandolu et al., Microelectronic Devices with Support Pillars Spaced Along a Slit Region Between Pillar Array Blocks, and Related Methods and Systems, filed Oct. 5, 2020, U.S. Appl. No. 17/063,101. 65 pages.

International Search Report for Application No. PCT/US2022/011198, mailed Apr. 22, 2022, 3 pages.

Taiwanese Search Report and Office Action from Taiwanese Application No. 111102549, dated Sep. 23, 2022, 13 pages with English translation.

Written Opinion of the International Searching Authority for Application No. PCT/US2022/011198, mailed Apr. 22, 2022, 5 pages.

\* cited by examiner

*1700*

*1800*

ELECTRONIC DEVICES COMPRISING A STACK STRUCTURE, A SOURCE CONTACT, AND A DIELECTRIC MATERIAL

CROSS-REFERENCE TO RELATED APPLICATION

This application is a continuation of U.S. patent application Ser. No. 17/158,918, filed Jan. 26, 2021, now U.S. Pat. No. 11,948,992, issued Apr. 2, 2024, the disclosure of which is hereby incorporated herein in its entirety by this reference.

TECHNICAL FIELD

Embodiments of the disclosure relate to the field of electronic device design and fabrication. More particularly, the disclosure relates to electronic devices having a dielectric material, such as a doped dielectric material or a high-k dielectric material, between a source contact and tiers, to related apparatus and electronic systems, and to methods for forming the electronic devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to a bit line, and the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

In conventional 3D NAND electronic devices, the pillars including the channels are formed through multiple polysilicon materials, and lateral contact with the channels is achieved by a laterally-oriented, doped polysilicon material. However, etching through the multiple polysilicon materials causes processing challenges due to a total thickness of the polysilicon materials. In addition, polysilicon over the doped polysilicon material for the lateral contact causes shielding of the electric field from the bottom tiers, making the portion of the channel difficult to turn on during read operation.

Therefore, designing and fabricating electronic devices continues to be challenging with desired electrical performance.

DETAILED DESCRIPTION

Figure 1A:
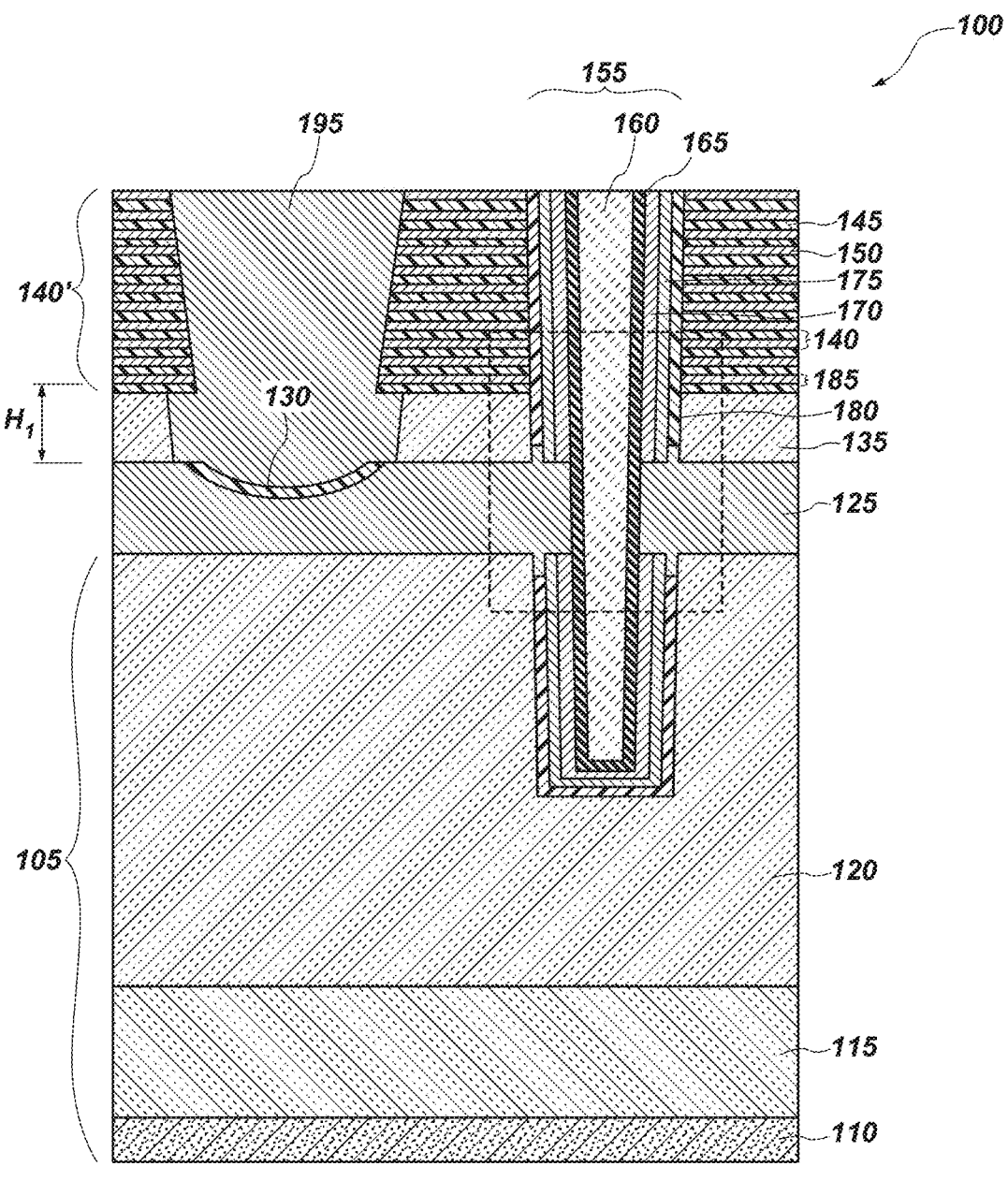
FIGS. 1A and 1B are cross-sectional, elevational, schematic illustrations of an electronic device in accordance with embodiments of the disclosure, with FIG. 1B being an enlargement of the region indicated in FIG. 1A.

Electronic devices (e.g., apparatus, microelectronic devices) and systems (e.g., electronic systems) according to embodiments of the disclosure include a doped dielectric material or a high-k dielectric material between a source contact and tiers of alternating dielectric materials and conductive materials of the electronic devices. The source contact extends laterally and contacts a channel of pillars of the electronic device. The doped dielectric material separates the source contact from the tiers. By including the doped dielectric material, a distance between the source contact and a select gate source of the tiers is controllable. The doped dielectric material provides an offset between the channel and the select gate source. In addition, the doped dielectric material reduces electrical field termination and interactions between the source contact and the tiers.

Fabrication of the electronic device includes forming and removing multiple sacrificial structures to form the doped dielectric material between the source contact and tiers of alternating dielectric materials and nitride materials. A source contact sacrificial structure is used to form the source contact in a desired location and a slit sacrificial structure is used to provide lateral access to the pillars. The source contact sacrificial structure may include similar materials (e.g., within the same material family) as materials of the pillars and/or materials of the tiers of the alternating dielectric materials and nitride materials. Dimensions of the source contact sacrificial structure are similar to desired dimensions of the source contact, which is connected to the channel of the pillars of the electronic device. In contrast to conventional electronic devices, the electronic devices according to embodiments of the disclosure include the doped dielectric material or the high-k dielectric material between the source and the select gate source instead of a doped polysilicon material. By including similar materials in the source contact sacrificial structure, the tiers of the dielectric materials and the nitride materials, and/or the pillars, the electronic devices according to embodiments of the disclosure may be formed by a less complex process.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material, an insulative nitride material, an insulative oxynitride material, an insulative carboxynitride material, and/or air. A dielectric oxide material may be an oxide material, a metal oxide material, or a combination thereof. The dielectric oxide material may include, but is not limited to, a silicon oxide ($SiO_x$, silicon dioxide ($SiO_2$)), phosphosilicate glass (PSG), borosilicate glass (BSG), borophosphosilicate glass (BPSG), fluorosilicate glass (FSG), aluminum oxide ($AlO_x$), barium oxide, gadolinium oxide ($GdO_x$), hafnium oxide ($HfO_x$), magnesium oxide ($MgO_x$), molybdenum oxide, niobium oxide ($NbO_x$), strontium oxide, tantalum oxide ($TaO_x$), titanium oxide ($TiO_x$), yttrium oxide, zirconium oxide ($ZrO_x$), hafnium silicate, a dielectric oxynitride material (e.g., $SiO_xN_y$), a dielectric carbon nitride material (SiCN), a dielectric carboxynitride material (e.g., $SiO_xC_zN_y$), a combination thereof, or a combination of one or more of the listed materials with silicon oxide, where values of "x," "y," and "z" may be integers or may be non-integers. A dielectric nitride material may include, but is not limited to, silicon nitride. A dielectric oxynitride material may include, but is not limited to, a silicon oxynitride ($SiO_xN_y$). A dielectric carboxynitride material may include, but is not limited to, a silicon carboxynitride ($SiO_xC_zN_y$). The dielectric material may be a stoichiometric compound or a non-stoichiometric compound.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide ($SiO_x$), such as silicon dioxide ($SiO_2$). The dielectric constant of silicon dioxide is from about 3.7 to about 3.9. The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide. The term "high-k dielectric material" is a relative term and is distinguished from the term "dielectric material" by a relative value of its dielectric constant. Materials listed above as examples of a "dielectric material" may overlap with some of the materials listed above as examples of a "high-k dielectric material" since the terms are relative.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "opening" and "slit" mean and include a volume extending through at least one structure or at least one material, leaving a void (e.g., gap) in that at least one structure or at least one material, or a volume extending between structures or materials, leaving a gap between the structures or materials. Unless otherwise described, an "opening" and/or "slit" is not necessarily empty of material. That is, an "opening" and/or "slit" is not necessarily void space. An "opening" and/or "slit" formed in or between structures or materials may comprise structure(s) or material(s) other than that in or between which the opening is formed. And, structure(s) or material(s) "exposed" within an "opening" and/or "slit" is (are) not necessarily in contact with an atmosphere or non-solid environment. Structure(s) or material(s) "exposed" within an "opening" and/or "slit" may be adjacent or in contact with other structure(s) or material(s) that is (are) disposed within the "opening" and/or "slit."

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
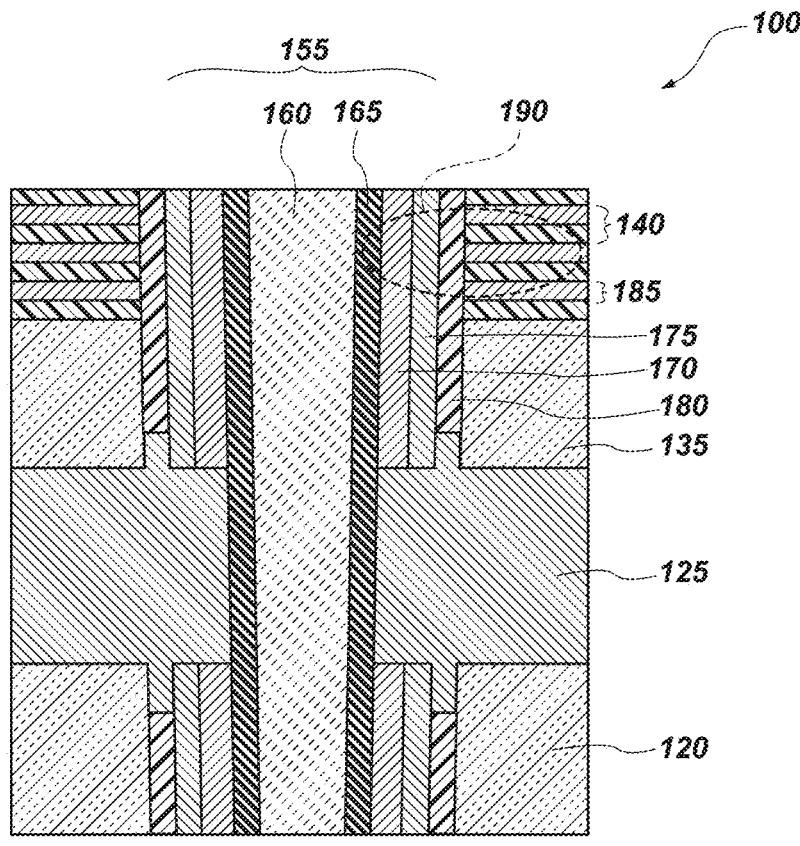

An electronic device 100 according to embodiments of the disclosure is shown in FIGS. 1A and 1B. The electronic device 100 includes a source stack 105 that includes one or more conductive materials, such as conductive material 110 (e.g., conductive liner material 110), source material 115, and a doped semiconductive material 120. The conductive liner material 110 is adjacent to (e.g., on) a base material (not shown), the source material 115 is adjacent to (e.g., vertically adjacent to, on) the conductive liner material 110, and the doped semiconductive material 120 is adjacent to (e.g., vertically adjacent to, on) the source material 115. A source contact 125 is adjacent to (e.g., vertically adjacent to, on) the source stack 105 and includes an oxidized portion 130. A doped dielectric material 135 is adjacent to (e.g., vertically adjacent to, on) the source contact 125. A material of the doped dielectric material 135 is selected to be selectively removable under some etch conditions and to be resistant to removal under other etch conditions.

Tiers 140 of alternating dielectric materials 145 and conductive materials 150 are adjacent to (e.g., vertically adjacent to, on) the doped dielectric material 135. Some of the conductive materials 150 are configured as so-called "replacement gate" word lines (e.g., word lines formed by a so-called "replacement gate" or "gate late" process). Other conductive materials 150, such as one or more of the lowermost conductive materials 150, are configured as select gate sources (SGS) 185 and one or more of the uppermost conductive materials 150 are configured as select gate drains.

Pillars 155 (e.g., memory pillars) extend through the tiers 140, the doped dielectric material 135, the source contact 125, and at least partially into the doped semiconductive material 120. The pillars 155 include a fill material 160, a channel 165, a tunnel dielectric material 170, a charge trap material 175, and a charge blocking material 180. The tunnel dielectric material 170, the charge trap material 175, and the charge blocking material 180 function as tunneling structures of the pillars 155 of the electronic device 100. One or more of the tiers 140 proximal to the doped dielectric material 135 functions as a select gate source (SGS) 185 and one or more of the tiers 140 distal to the doped dielectric material 135 functions as a select gate drain (SGD). The tiers 140 form a tier stack 140' adjacent to the doped dielectric material 135. A height $H_1$, which is the distance separating the source contact 125 from the SGS 185 of the tiers 140, corresponds to the thickness of the doped dielectric material 135 and the adjacent dielectric material 145 of the tiers 140.

FIG. 1B is an enlargement of the portion of FIG. 1A indicated by the dashed line. Memory cells 190 are indicated by the dashed oval in FIG. 1B and are located at intersections of cell films of the pillars 155 and the conductive materials 150 of the tiers 140. The memory cells 190 are laterally adjacent to the conductive materials 150 of the tiers 140. The source contact 125 is in direct contact with a lower surface (e.g., a lower horizontal surface) of the doped dielectric material 135 and in direct contact with an upper surface of the doped semiconductive material 120. The source contact 125 also is in direct contact with a portion of the pillar 155, such as directly contacting upper horizontal surfaces and lower horizontal surfaces of the tunnel dielectric material 170, the charge trap material 175, and the charge blocking material 180 and directly contacting the channel 165. The tunnel dielectric material 170, the charge trap material 175, and the charge blocking material 180 of the pillar 155 are separated into discrete portions that extend above and below the source contact 125, while the channel 165 and the fill material 160 extend substantially continuously an entire height of the pillars 155. However, the fill material 160 may include an interior void. The source contact 125 is separated from (e.g., isolated from) a lowermost tier (e.g., the SGS 185) by the doped dielectric material 135. The height $H_1$ of the doped dielectric material 135 provides improved control of electron flow through the channel 165 and reduced charge trap compared to conventional electronic devices that include a doped polysilicon material in a similar position.

Figure 2:
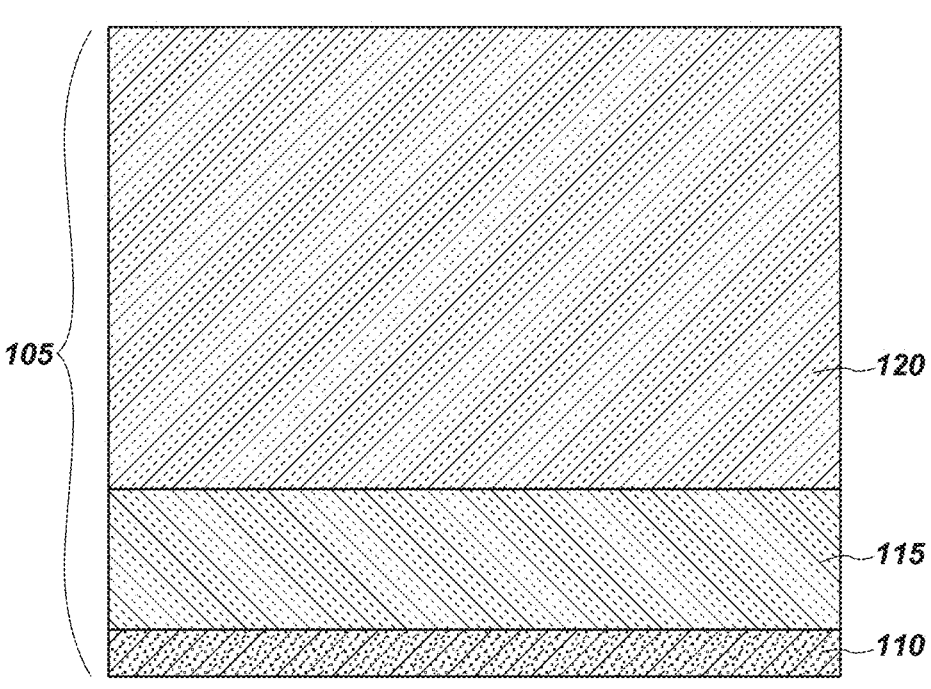
FIGS. 2-14 are cross-sectional, elevational, schematic illustrations during various processing acts to fabricate an electronic device in accordance with embodiments of the disclosure.

The electronic device 100 according to embodiments of the disclosure may be formed as illustrated in FIGS. 2-14. As shown in FIG. 2, the source stack 105 is formed adjacent to the base material (not shown) and includes one or more conductive materials, with the conductive liner material 110 formed adjacent to the base material, the source material 115 formed adjacent to the conductive liner material 110, and the doped semiconductive material 120 formed adjacent to the source material 115. In some embodiments, the conductive liner material 110 is formed of and includes titanium nitride, the source material 115 is formed of and includes tungsten silicide ($WSi_x$), and the doped semiconductive material 120 is formed of and includes a doped polysilicon material. However, the conductive liner material 110, the source material 115, and the doped semiconductive material 120 may be formed of and include other conductive materials. Each of the conductive liner material 110, source material 115, and doped semiconductive material 120 may be formed by conventional techniques and to a desired thickness. By way of example only, the conductive liner material 110 may be formed to a thickness of from about 200 Å to about 400 Å, the source material 115 may be formed to a thickness of from about 800 Å to about 1000 Å, and the doped semiconductive material 120 may be formed to a thickness of from about 2000 Å to about 4000 Å.

Figure 3:
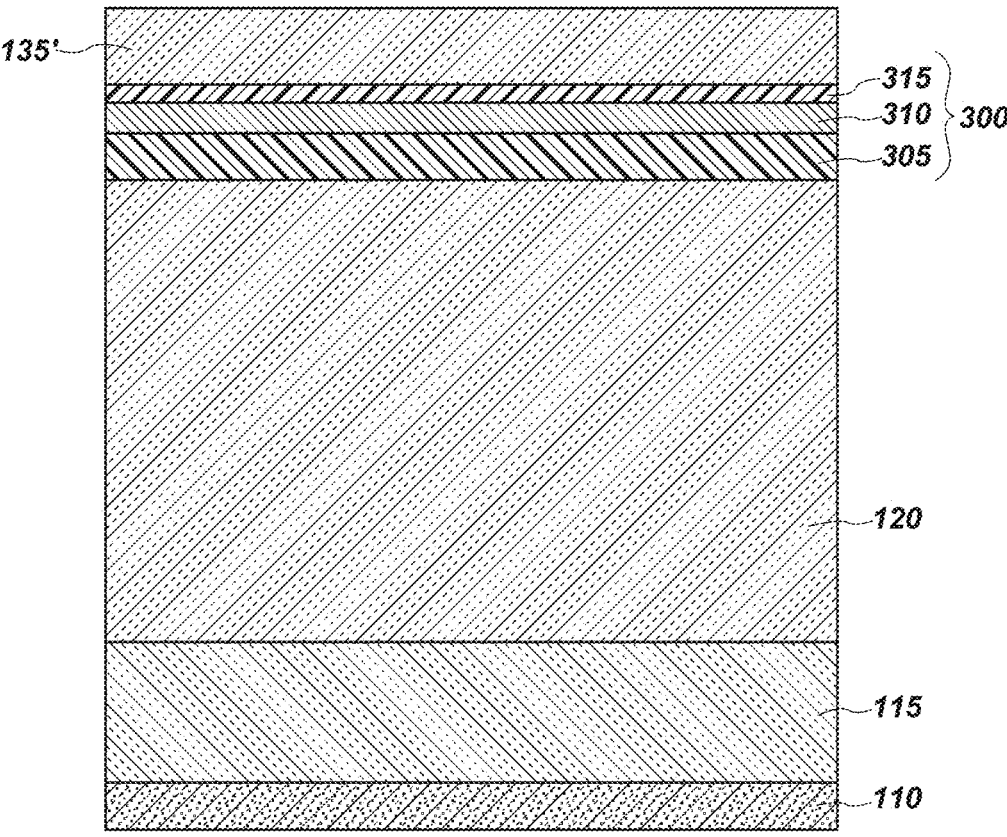

A source contact sacrificial structure 300 is formed over the source stack 105, as shown in FIG. 3. The source contact sacrificial structure 300 may include a first sacrificial material 305, a second sacrificial material 310, and a third sacrificial material 315, each of which is formed by conventional techniques. Materials of the first sacrificial material 305, the second sacrificial material 310, and the third sacrificial material 315 may be selectively etchable relative to one another and relative to other materials of the electronic device 100. However, the first sacrificial material 305 and the third sacrificial material 315 may be the same material (e.g., the same chemical composition) or may be a different material (e.g., a different chemical composition). By way of example only, the first sacrificial material 305, the second sacrificial material 310, and the third sacrificial material 315 may be dielectric materials, such as a silicon oxide material or a silicon nitride material, that are selectively etchable. In some embodiments, the first sacrificial material 305 is a highly conformal silicon dioxide, the second sacrificial material 310 is silicon nitride, and the third sacrificial material 315 is tetraethylorthosilicate (TEOS). However, other combinations of dielectric materials may be used. In addition, the source contact sacrificial structure 300 may be formed of and include two materials or more than three materials. Removal of the source contact sacrificial structure 300 provides lateral access for the subsequently formed source contact 125 to contact the pillars 155.

A location of the source contact sacrificial structure 300 corresponds to the location at which the source contact 125 is ultimately formed, and a total thickness of the as-formed source contact sacrificial structure 300 may be determined by a desired thickness of the source contact 125 (see FIGS. 1A and 1B). Individual thicknesses of each of the first sacrificial material 305, the second sacrificial material 310, and the third sacrificial material 315 may be selected based on the desired thickness of the source contact 125. By way of example only, the first sacrificial material 305 may be formed to a thickness of from about 30 Å to about 400 Å, the second sacrificial material 310 may be formed to a thickness of from about 100 Å to about 300 Å, and the third sacrificial material 315 may be formed to a thickness of from about 30 Å to about 200 Å. The thickness of each of the first sacrificial material 305, the second sacrificial material 310, and the third sacrificial material 315 may be sufficient to protect cell film materials of the pillars 155 and the source stack 105 during subsequently conducted process acts that provide access to the pillars 155 by sequentially removing portions of the cell films.

A doped dielectric material 135', from which the doped dielectric material 135 is formed, is adjacent to the source contact sacrificial structure 300 and may be formed by conventional techniques. The doped dielectric material 135' may be a dielectric material that is resistant to etch conditions (e.g., etch chemistries and process conditions) used during subsequent process acts, such as to. By way of example only, the doped dielectric material 135' may be resistant to phosphoric acid-based etch chemistries, to hydrogen fluoride (HF), or to other halogen-based etch chemistries.

In addition to providing the desired etch selectivity, the doped dielectric material 135' may be easily integrated into the process of forming the electronic device 100 according to embodiments of the disclosure. The doped dielectric material 135 may function as a so-called "capping material" to prevent removal processes from removing portions of the tier oxide during removal of the cell films. The doped dielectric material 135 also provides improved channel conductance at the source contact 125, by avoiding shielding the electrical field from the SGS 185 of the tiers 140. By eliminating a portion of the cell films buried in the source conductor, such as the polysilicon on the source contact 125, the channel conductance is improved.

The doped dielectric material 135' may be a doped silicon nitride material or a doped silicon oxide (e.g., silicon dioxide) material. By way of example only, the doped dielectric material 135' may be a carbon-doped dielectric material, such as a carbon-doped silicon nitride material, a carbon-doped silicon oxide material, or a carbon-doped silicon oxynitride material. In some embodiments, the doped dielectric material 135' is carbon-doped silicon dioxide. Alternatively, the doped dielectric material may be a boron-doped dielectric material, such as a boron-doped silicon nitride material, a boron-doped silicon oxide material, or a boron-doped silicon oxynitride material. The dopant in the dielectric material may be present at a concentration sufficient to provide the desired etch selectivity without providing conductivity to the dielectric material. The dopant concentration may be tailored to achieve the desired etch selectivity of the doped dielectric material 135'. The dopant may be present in the dielectric material at a concentration of from about 1% by weight to about 12% by weight. While embodiments herein describe the dielectric material between the source contact 125 and the tier stack 140' as being a doped dielectric material, a high-k dielectric material that exhibits the desired etch selectivity may, alternatively, be used. The high-k dielectric material may include, but is not limited to, hafnium oxide (HfO$_x$), aluminum oxide (AlO$_x$), antimony oxide (SbO$_x$), cerium oxide (CeO$_x$), gallium oxide (GaO$_x$), lanthanum oxide (LaO$_x$), niobium oxide (NbO$_x$), titanium oxide (TiO$_x$), zirconium oxide (ZrO$_x$), tantalum oxide (TaO$_x$), magnesium oxide (MgO$_x$), or a combination thereof.

A thickness of the doped dielectric material 135' may be from about 400 Å to about 1000 Å, such as from about 400 Å to about 600 Å, from about 450 Å to about 550 Å, from about 450 Å to about 700 Å, from about 500 Å to about 700 Å, from about 600 Å to about 800 Å, from about 700 Å to about 900 Å, or from about 800 Å to about 1000 Å. The thickness of the doped dielectric material 135' may be selected depending on a desired distance between the source contact 125 and the SGS 185 of the tier stack 140' (see FIGS. 1A and 1B). The thickness of the doped dielectric material 135' may be sufficient to separate (e.g., physically separate) the source contact 125 from the SGS 185 by a desired distance. The doped dielectric material 135' may also function as an etch stop material during subsequent process acts. In some embodiments, the thickness of the doped dielectric material 135' is about 500 Å.

Figure 4:
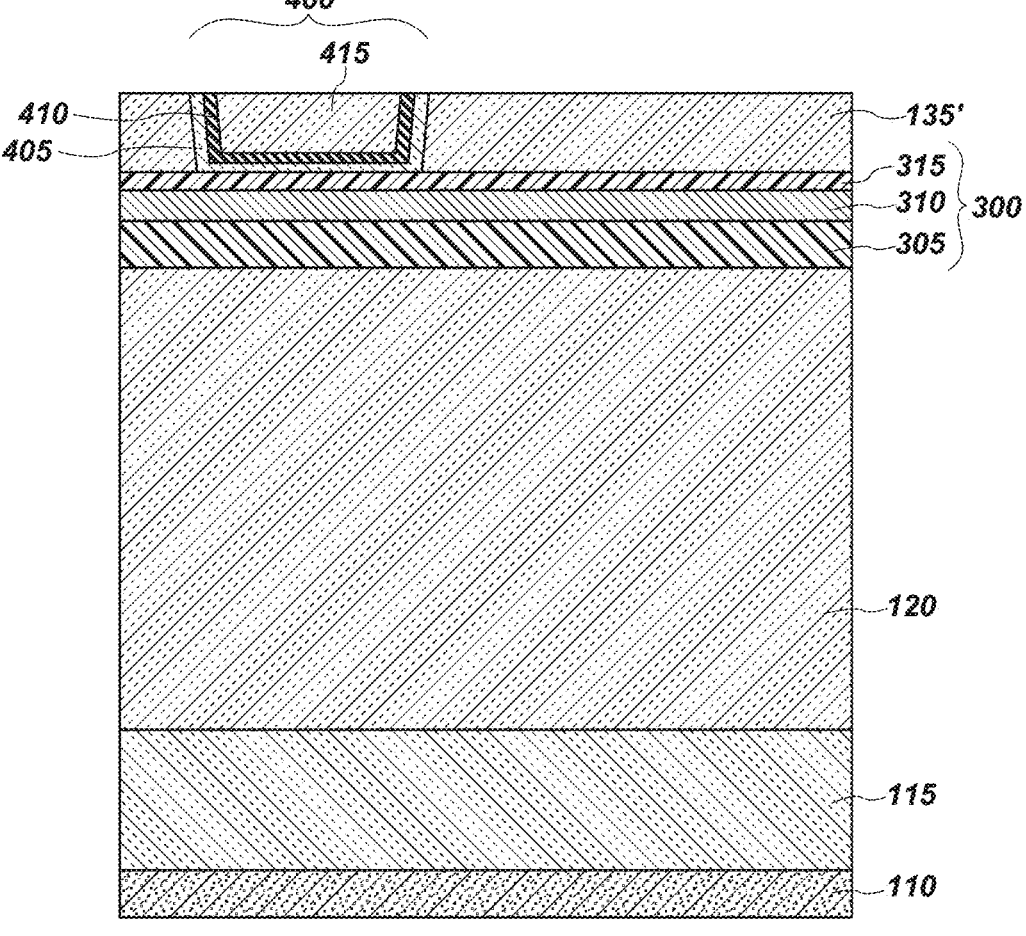

A slit sacrificial structure 400 is formed in the doped dielectric material 135', as shown in FIG. 4. The slit sacrificial structure 400 may be formed of and include one or more materials that are selective etchable relative to the materials of tiers 500 (see FIG. 5). The slit sacrificial structure 400 may also function as an etch stop during subsequent process acts. The slit sacrificial structure 400 may extend through the doped dielectric material 135' and, optionally, partially into the third sacrificial material 315 of the source contact sacrificial structure 300. A location of the slit sacrificial structure 400 corresponds to a location adjacent to which (e.g., over which) a slit 700 (see FIG. 7) is subsequently formed. The slit sacrificial structure 400 may, for example, include a dielectric material 405, a liner 410, and a etch stop material 415. By way of example only, the dielectric material 405 may be a silicon oxide material, the liner 410 may be a titanium nitride material, and the etch stop material 415 may be tungsten or a tungsten-containing material. The etch stop material 415 may be configured as a plug. Alternatively, the slit sacrificial structure 400 may be formed of a single material, such as aluminum oxide, two materials, or more than three materials as long as the material(s) provide the desired etch selectivity and etch stop functions.

Figure 5:
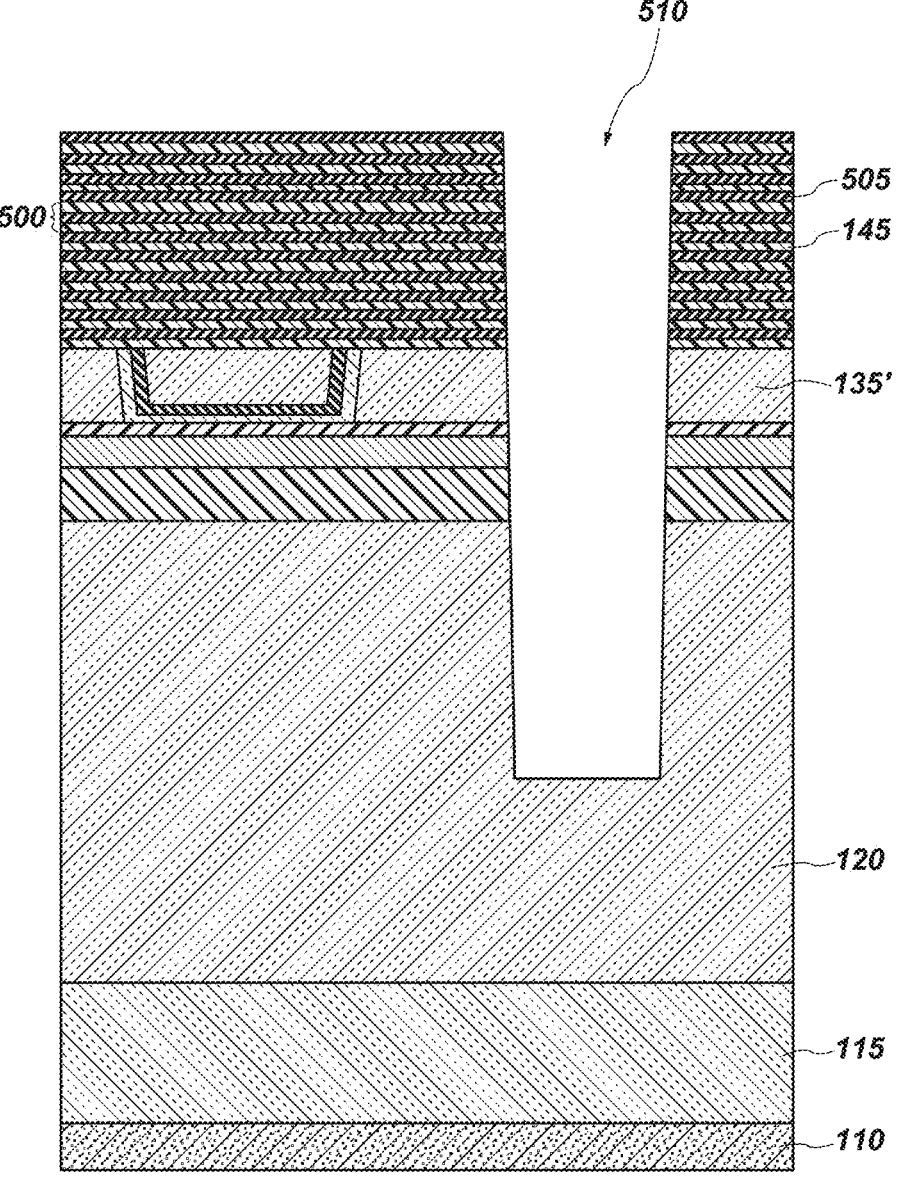

Tiers 500 of alternating nitride materials 505 and dielectric materials 145 are formed adjacent to (e.g., on) the slit sacrificial structure 400 and the doped dielectric material 135', as shown in FIG. 5. The tiers 500 may be formed by conventional techniques. A pillar opening 510 is formed through the tiers 500 and at least partially into the doped semiconductive material 120, exposing surfaces of the tiers 500, the doped dielectric material 135', the source contact sacrificial structure 300, and the doped semiconductive material 120. The pillar opening 510 may be formed by conventional techniques, such as by conventional photolithography and removal processes. The portions of the tiers 500, the doped dielectric material 135', the source contact sacrificial structure 300, and the doped semiconductive material 120 may be removed by one or more conventional etch processes, such as a conventional dry etch process. A depth of the pillar opening 510 may be sufficient to provide mechanical stability to (e.g., anchor) the pillars 155 in the electronic device 100, such as a depth of from about 1000 Å to about 4000 Å, from an upper surface of the doped semiconductive material 120. For example, the depth of the pillar opening 510 may extend from about 1000 Å to about 3500 Å, from about 1000 Å to about 3000 Å, or from about 1000 Å to about 2500 Å from the upper surface of the doped semiconductive material 120. While FIG. 5 illustrates the pillar opening 510 as extending partially into the doped semiconductive material 120, the pillar opening 510 may extend through the doped semiconductive material 120 and contact the source material 115.

Figure 6:
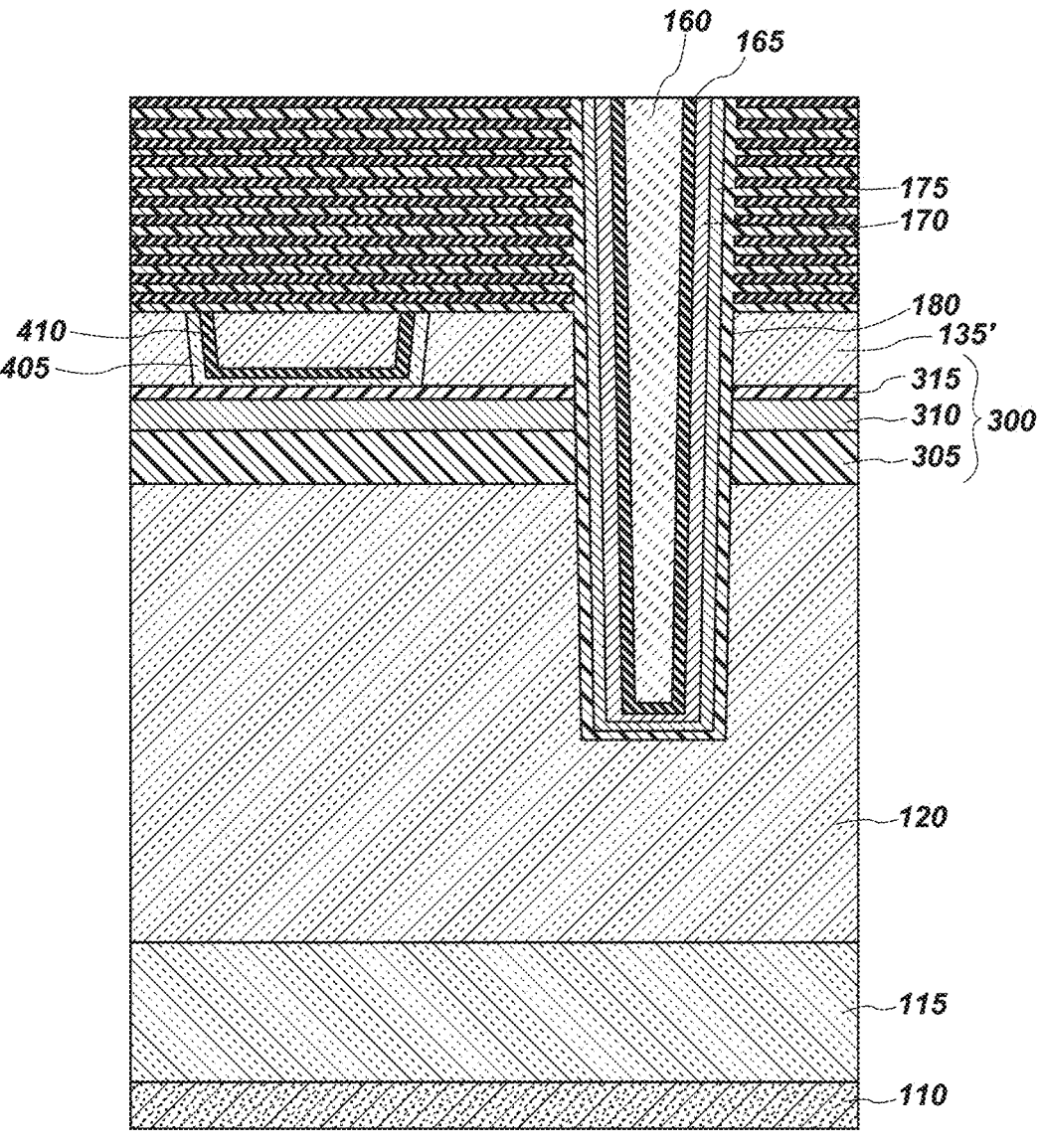

Cell films of the pillars 155 are formed in the pillar opening 510, as shown in FIG. 6. The charge blocking material 180, the charge trap material 175, the tunnel dielectric material 170, and the channel 165 may be conformally formed in the pillar opening 510 by conventional techniques. The fill material 160 may be formed in a remaining volume of the pillar opening 510 by conventional techniques. One or more voids may be present in the interior of the fill material 160. The charge blocking material 180, the charge trap material 175, the tunnel dielectric material 170, the channel 165, and the fill material 160 are positioned in order from the outermost material to the innermost material relative to an axial centerline of the pillar 155.

The charge blocking material 180 may be formed of and include a dielectric material. By way of example only, the charge blocking material 180 may be one or more of an oxide (e.g., silicon dioxide), a nitride (silicon nitride), and an oxynitride (silicon oxynitride), or another material. In some embodiments, the charge blocking material 180 is silicon dioxide.

The charge trap material 175 may be formed of and include at least one memory material and/or one or more conductive materials. The charge trap material 175 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material 175 is silicon nitride.

The tunnel dielectric material 170 may include one or more dielectric materials, such as one or more of a silicon nitride material or a silicon oxide material. In some embodiments, the tunnel dielectric material 170 is a so-called "ONO" structure that includes silicon dioxide, silicon nitride, and silicon dioxide.

The channel 165 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel 165 is polysilicon, such as a doped polysilicon. The channel 165 may be configured as a so-called doped hollow channel (DHC) or other configuration. The fill material 160 may be a dielectric material, such as silicon dioxide.

Figure 7:
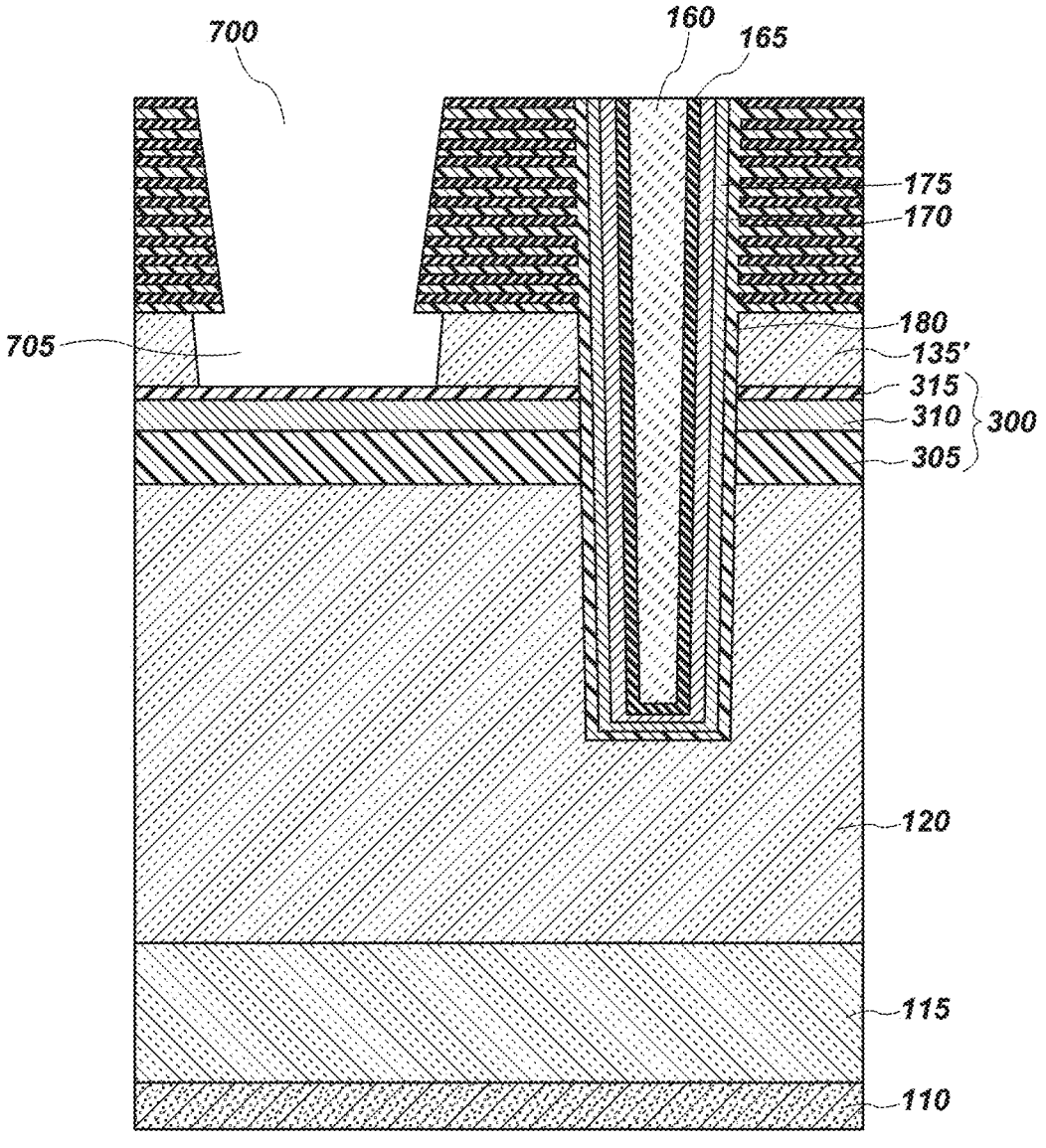

A portion of the tiers 500 and the slit sacrificial structure 400 is removed, as shown in FIG. 7, to form a slit 700 through the tiers 500 and a lower opening 705 in the doped dielectric material 135, exposing the source contact sacrificial structure 300. The tiers 500 and the slit sacrificial structure 400 may be removed by one or more etch processes, such as by using conventional etch conditions. The slit sacrificial structure 400 may be substantially completely removed or at least the liner 410 and the etch stop material 415 of the slit sacrificial structure 400 are removed, with a portion of the dielectric material 405, optionally, remaining adjacent to the doped dielectric material 135. If a single etch process is conducted, the tiers 500 and the slit sacrificial structure 400 may be substantially removed by the single etch process. If more than one etch process is conducted, the etch stop material 415 of the slit sacrificial structure 400 may function as an etch stop during the first etch process to form the slit 700 and a second etch process may be conducted to remove the slit sacrificial structure 400. For convenience, the slit 700 and the lower opening 705 are collectively referred to hereinafter as the slit 700. While FIG. 7 illustrates the slit 700 as extending through the tiers 500 and the doped dielectric material 135 to an upper surface of the third sacrificial material 315, the slit 700 may extend partially into the third sacrificial material 315.

Figure 8:
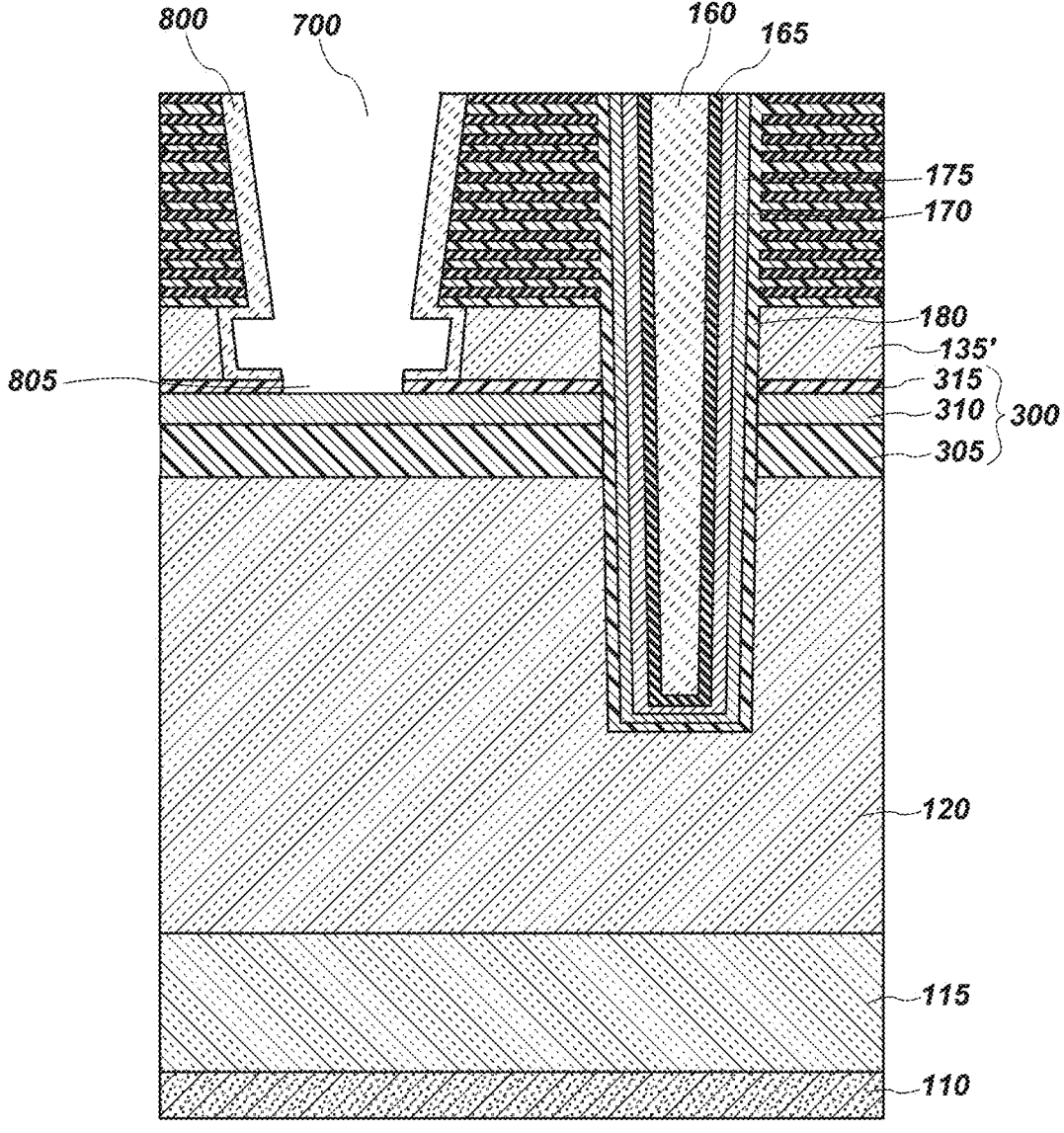

As shown in FIG. 8, a slit liner 800 is formed on exposed surfaces of the tiers 500, the slit sacrificial structure 400, and the third sacrificial material 315 in the slit 700. The slit liner 800 may be conformally formed by conventional techniques such that a portion of the slit 700 remains open (e.g., unoccupied). The slit liner 800 may be formed of and include a dielectric material, a semiconductive material, or a conductive material. In some embodiments, the slit liner 800 is undoped polysilicon. The slit liner 800 may be formed to a thickness of from about 200 Å to about 400 Å. A portion of the slit liner 800 is removed from a bottom surface of the slit 700, exposing the third sacrificial material 315 of the source contact sacrificial structure 300, which is also removed to form opening 805 in the third sacrificial material 315. The slit liner 800 and the third sacrificial material 315 at the bottom surface of the slit 700 may be removed by conventional techniques.

Figure 9:
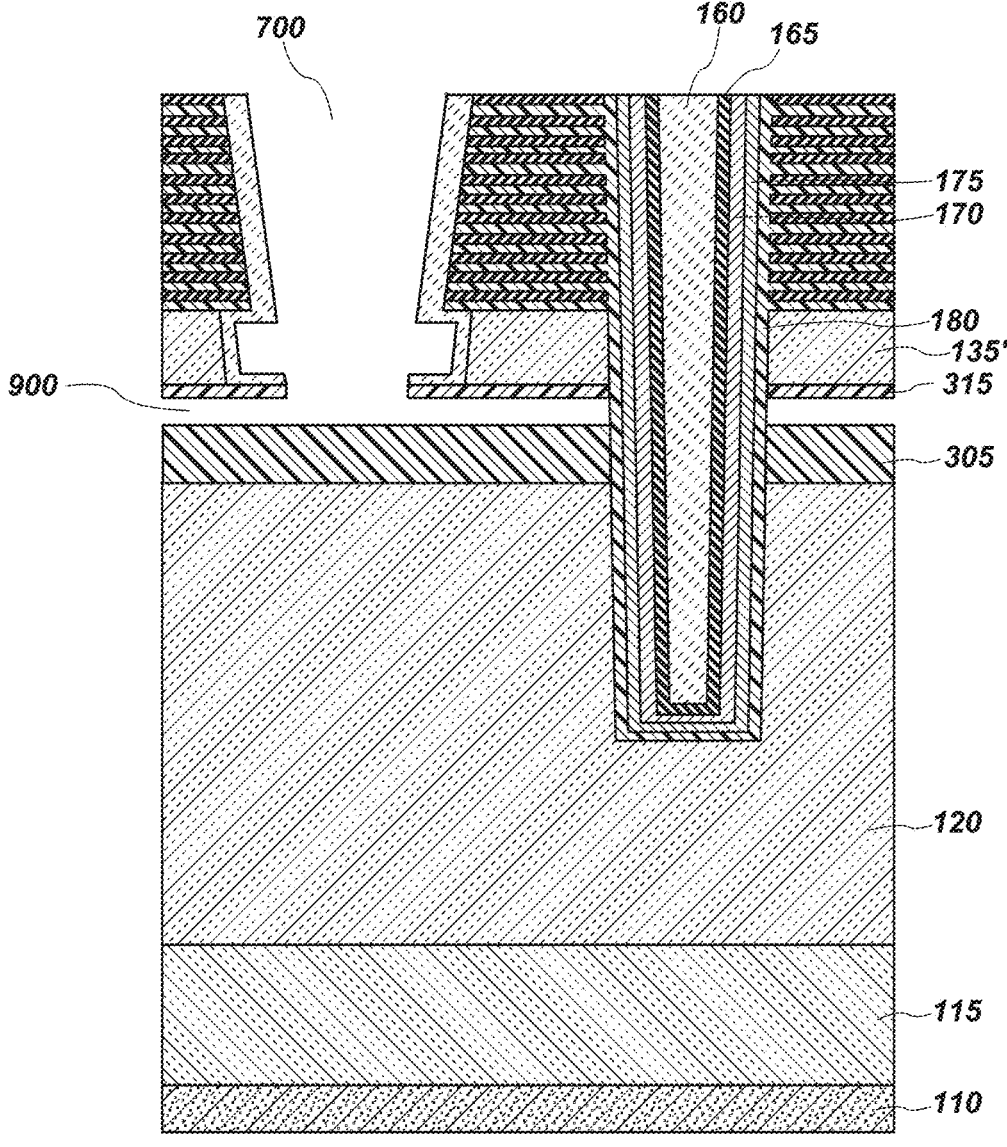

To provide access to the pillars 155, the source contact sacrificial structure 300 and portions of the cell films (charge blocking material 180, charge trap material 175, tunnel dielectric material 170) are sequentially removed, as shown in FIGS. 9-12. The source contact sacrificial structure 300 is removed while a majority of the doped dielectric material 135 remains intact by selecting the etch conditions used to remove the source contact sacrificial structure 300. In other words, the doped dielectric material 135 is substantially resistant to the etch conditions used to remove the source contact sacrificial structure 300. The second sacrificial material 310 is removed through the slit 700, as shown in FIG. 9, and a source contact opening 900 formed. As described below, the size of the source contact opening 900 is sequentially increased to provide access to the pillars 155 following the removal of the source contact sacrificial structure 300.

The second sacrificial material 310 of the source contact sacrificial structure 300 is selectively removed without substantially removing the first and third sacrificial materials 305, 315 or the charge blocking material 180. The second sacrificial material 310 may be selectively etched by conventional techniques, such as by conventional etch conditions, which are selected depending on the chemical composition of the second sacrificial material 310. Since the first sacrificial material 305, the third sacrificial material 315, and the charge blocking material 180 may be similar materials and exhibit slower etch rates than the etch rate of the second sacrificial material 310, the second sacrificial material 310 is substantially removed relative to the first sacrificial material 305, the third sacrificial material 315, and the charge blocking material 180. By way of example only, if the first sacrificial material 305, the third sacrificial material 315, and the charge blocking material 180 are silicon oxide materials and the second sacrificial material 310 is a silicon nitride material, an etch chemistry formulated to remove silicon nitride may be used, such as a phosphoric acid-based etch chemistry. The doped dielectric material 135 is not exposed to (e.g., is protected from) the etch conditions by the slit liner 800, the tiers 500, and the third sacrificial material 315.

Figure 10:
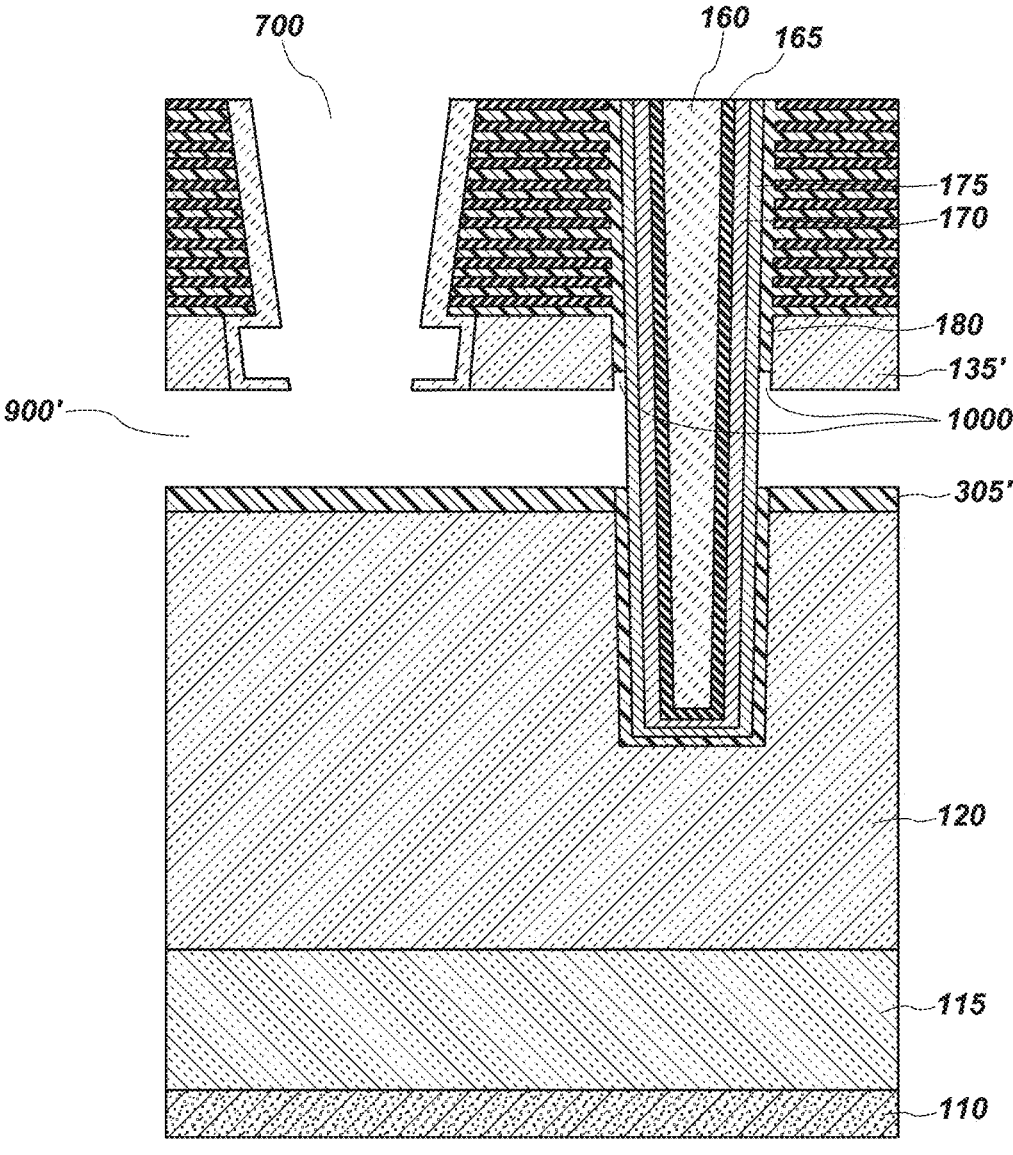

As shown in FIG. 10, an exposed portion of the charge blocking material 180 and the third sacrificial material 315 are selectively removed without substantially removing the slit liner 800. The charge blocking material 180 and the third sacrificial material 315 may be selectively etched by conventional techniques, which are selected depending on the chemical composition of the charge blocking material 180 and the third sacrificial material 315. By selecting the etch conditions, the charge blocking material 180 adjacent to the source contact opening 900 and the third sacrificial material 315 are removed. The third sacrificial material 315 may be substantially completely removed while the exposed portion of the charge blocking material 180, adjacent (e.g., laterally adjacent) to the source contact opening 900, is removed. Removing the third sacrificial material 315 and the portions of the charge blocking material 180 increases the size of the source contact opening 900, forming source contact opening 900'. Recesses 1000 in the vertical direction may also be formed. The recesses 1000 further increase the size of the source contact opening 900' proximal to the pillars 155. In addition, a portion of the first sacrificial material 305 may be removed, forming first sacrificial material 305'. In some embodiments, the doped dielectric material 135 is carbon-doped silicon nitride and is selectively etchable relative to silicon dioxide of the source contact sacrificial structure 300 and silicon dioxide of the pillars 155.

Although the third sacrificial material 315 is substantially completely removed, the first sacrificial material 305' remains adjacent to the source stack 105 due to the etch conditions selected. Since the first sacrificial material 305, the third sacrificial material 315, and the charge blocking material 180 may be similar materials (e g, similar in chemical composition), the materials exhibit substantially the same etch rates. However, the relative thicknesses of the charge blocking material 180 and the third sacrificial material 315 are less than the thickness of the first sacrificial material 305 and, therefore, the portion of the charge blocking material 180 and the third sacrificial material 315 are substantially removed while the first sacrificial material 305' remains over the source stack 105. By way of example only, if the first sacrificial material 305, the third sacrificial material 315, and the charge blocking material 180 are silicon oxide materials, an etch chemistry formulated to selectively remove silicon oxide materials may be used, such as an HF-based etch chemistry. Forming the source contact opening 900' also exposes a bottom horizontal surface of the doped dielectric material 135 and exposes a portion of the charge trap material 175. The bottom surface of the doped dielectric material 135 may be substantially coplanar with a bottom surface of the slit liner 800, while a bottom horizontal surface of the charge blocking material 180 is recessed relative to (e.g., not coplanar with) the bottom surfaces of the doped dielectric material 135 and the slit liner 800.

Figure 11:
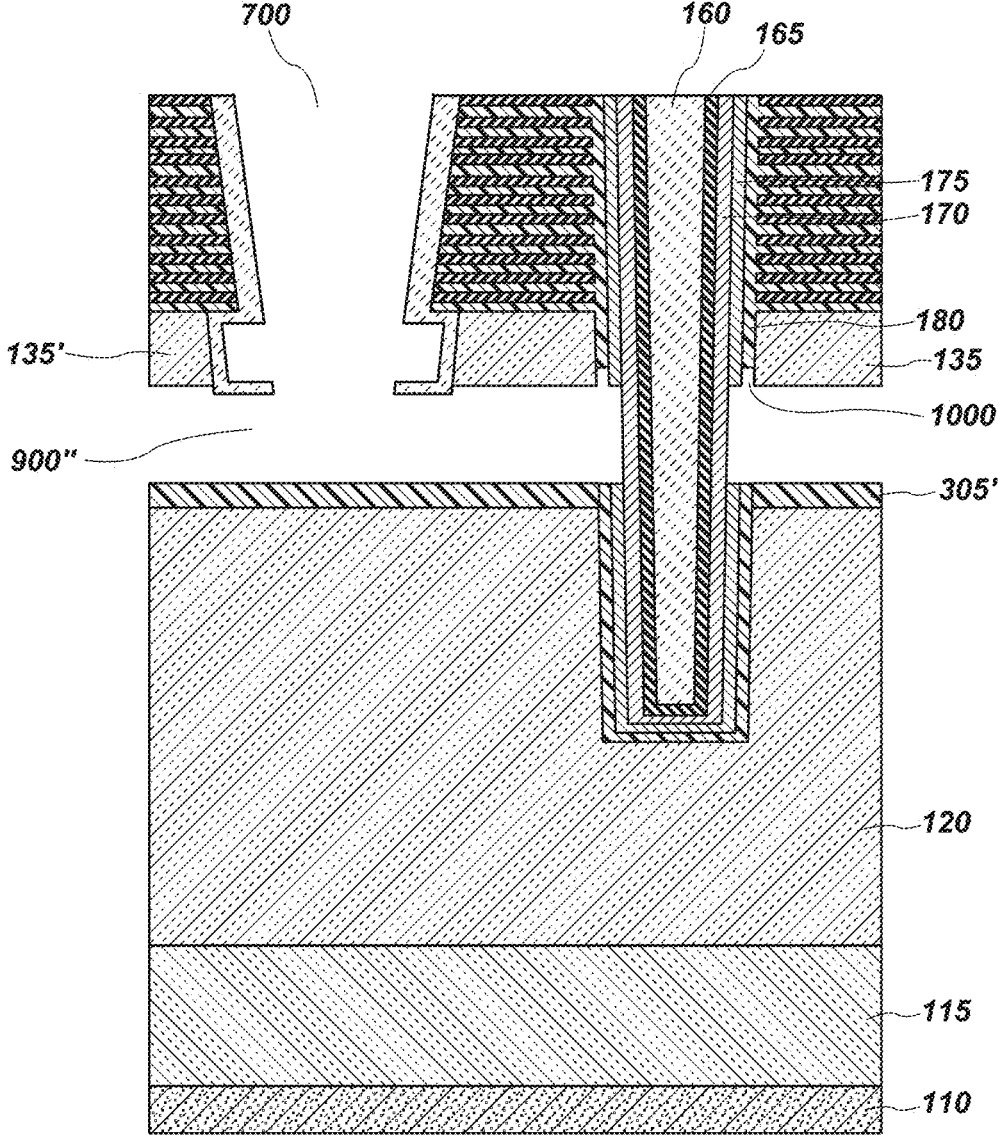

The exposed portion of the charge trap material 175 is then selectively removed, as shown in FIG. 11, without substantially removing the slit liner 800 or the first sacrificial material 305'. The portion of the charge trap material 175 laterally adjacent to the source contact opening 900' is removed by selectively etching the charge trap material 175, which exposes a portion of the tunnel dielectric material 170. The charge trap material 175 may be removed by conventional techniques. By way of example only, if the charge trap material 175 is a silicon nitride material, an etch chemistry formulated to remove silicon nitride may be used, such as a phosphoric acid-based etch chemistry. By selecting the etch conditions, the charge trap material 175 laterally adjacent to the source contact opening 900' is removed. A portion of the doped dielectric material 135 may also be removed, increasing the size of the source contact opening 900' to form source contact opening 900" and doped dielectric material 135'. A bottom horizontal surface of the charge trap material 175 may be recessed relative to (e.g., not coplanar with) a bottom horizontal surface of the doped dielectric material 135'. Alternatively, the bottom surface of the charge trap material 175 may be recessed relative to the bottom surface of the doped dielectric material 135', further increasing the size of the source contact opening 900" proximal to the pillars 155.

Figure 12:
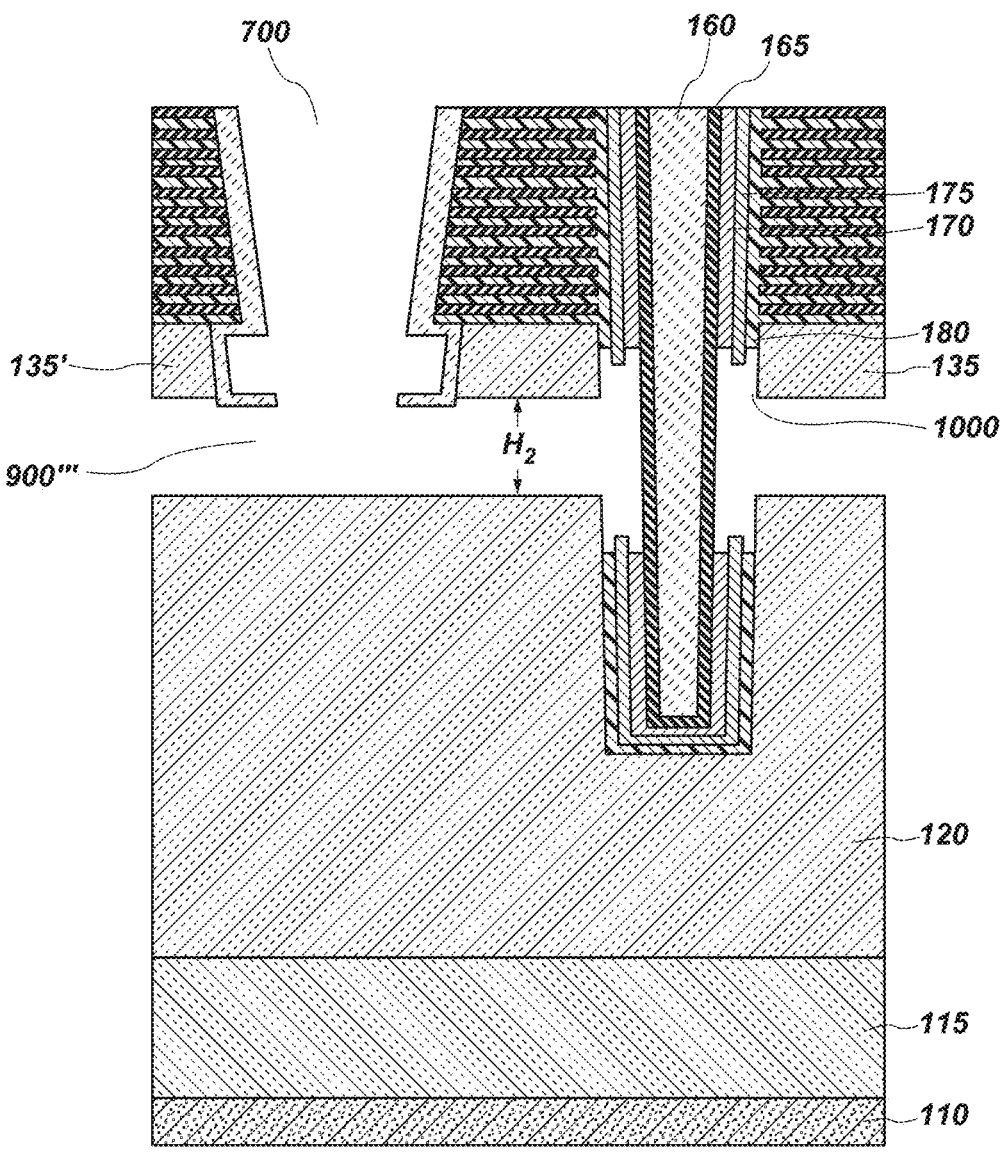

As shown in FIG. 12, the exposed portion of the tunnel dielectric material 170 is selectively removed, along with the remaining portion of the first sacrificial material 305 (i.e., the first sacrificial material 305'), increasing the size of the source contact opening 900" and forming source contact opening 900'''. The portion of the tunnel dielectric material 170 laterally adjacent to the source contact opening 900" is removed by selectively etching the tunnel dielectric material 170 relative to the doped dielectric material 135'. Removing the tunnel dielectric material 170 also exposes a portion of the channel 165. The exposed portion of the tunnel dielectric material 170 may be removed by conventional techniques. By selecting the etch conditions, the tunnel dielectric material 170 laterally adjacent to the source contact opening 900" is removed. By way of example only, if the tunnel dielectric material 170 is an ONO material, the etch chemistry may include, but is not limited to, an HF-based etch chemistry. The exposed portion of the channel 165 may ultimately be in contact with the source contact 125 (see FIGS. 1A and 1B).

The doped dielectric material 135' may function as an offset between the source stack 105 and the tiers 140 during the fabrication of the electronic devices 100 (see FIGS. 1A and 1B). Since the first sacrificial material 305, the second sacrificial material 310, and the third sacrificial material 315 of the source contact sacrificial structure 300 provide protection to (e.g., masking of) various materials during the process acts indicated in FIGS. 7-11, the initial thicknesses of the first sacrificial material 305, the second sacrificial material 310, and the third sacrificial material 315 are selected to be sufficiently thick to survive the etch conditions used to provide lateral access to the channel 165 of the pillars 155. The source contact opening 900''' exhibits a height Hz, which corresponds to a thickness of the source contact 125 ultimately formed in the source contact opening 900'''. The thickness of the source contact 125 (see FIGS. 1A and 1B) is greater than or equal to a combined thickness of the materials of the as-formed source contact sacrificial structure 300 (see FIG. 4). By determining the desired thickness of the source contact 125, the thickness of the source contact sacrificial structure 300 may be selected.

While the first sacrificial material 305, the second sacrificial material 310, and the third sacrificial material 315 have been removed (e.g., are not present) in the perspective of FIG. 12, these materials of the source contact sacrificial structure 300 may be present in other portions (not shown) of the electronic device 100, such as in portions of the electronic device 100 distal to the slit 700. The source contact sacrificial structure 300 may be present (e.g., visible), for example, in peripheral regions of the electronic device 100. In other words, the source contact sacrificial structure 300 may be positioned between the doped semiconductive material 120 and the doped dielectric material 135 in the other portions of the electronic device 100. Therefore, although the source contact 125 is present between the doped dielectric material 135 and the source stack 105 of the electronic device 100 in the perspectives shown in FIGS. 1A and 1B, the other portions of the electronic device 100 will include the source contact sacrificial structure 300 between the doped dielectric material 135 and the source stack 105.

The source contact opening 900''' may provide access (e.g., lateral access) to the pillars 155 following the substantially complete removal of the source contact sacrificial structure 300, which exposes the channel 165. While FIG. 12 illustrates the exposed horizontal surfaces of the tunnel dielectric material 170 and the charge trap material 175 proximal to the doped dielectric material 135 as being substantially coplanar with each other and with the exposed horizontal surfaces of the doped dielectric material 135', the exposed horizontal surfaces of the charge trap material 175 may be recessed relative to the exposed horizontal surfaces of the tunnel dielectric material 170 depending on the etch conditions used. The exposed horizontal surfaces of the charge trap material 175 may be recessed to a point intermediate that of the exposed horizontal surfaces of the charge blocking material 180 and the tunnel dielectric material 170. The exposed horizontal surfaces of the tunnel dielectric material 170 may also be recessed relative to the exposed horizontal surfaces of the doped dielectric material 135' and of the charge trap material 175. Therefore, the size of the source contact opening 900''' may be further increased proximal to the pillars 155.

Figure 13:
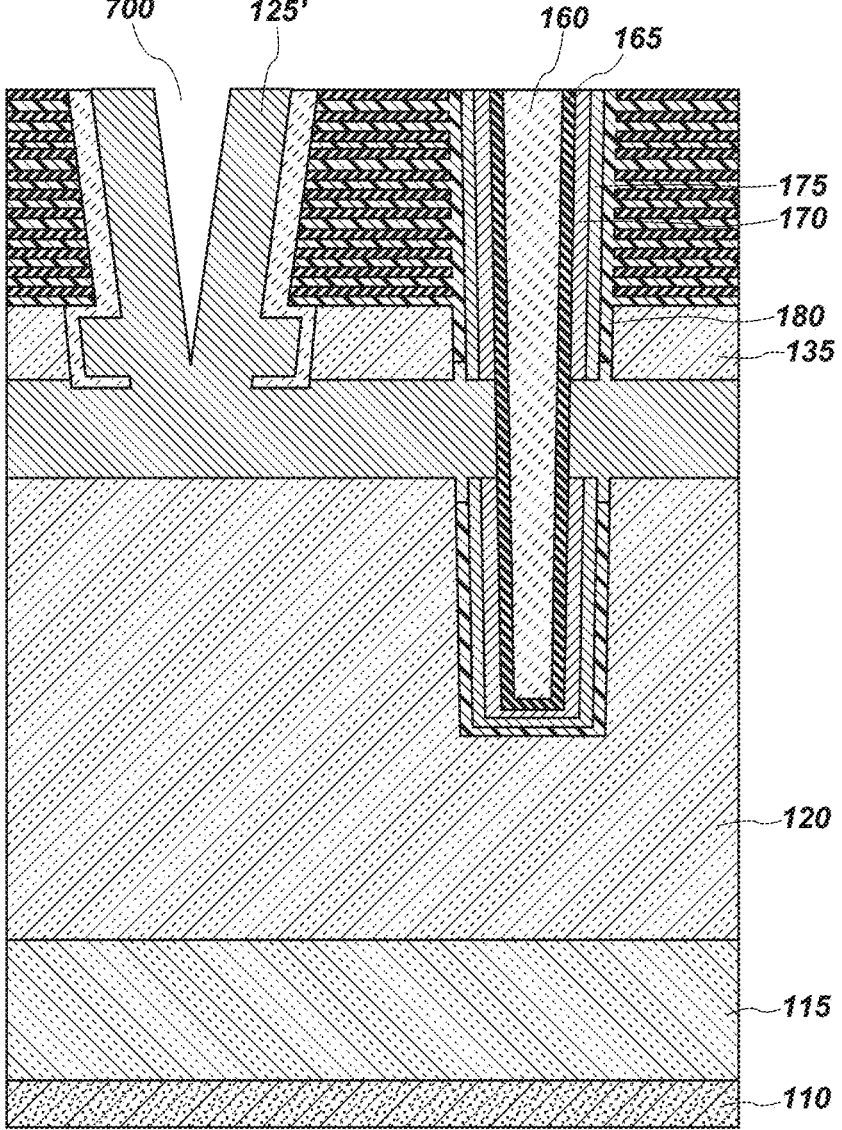

As shown in FIG. 13, a conductive material 125' of the source contact 125 is formed within the source contact opening 900'''. The conductive material 125' may be conformally formed in the source contact opening 900''', substantially completely filling the source contact opening 900''' and filling a portion of the slit 700. In some embodiments, the conductive material 125' is polysilicon, such as N⁺ doped polysilicon. The conductive material 125' may be formed at a thickness of from about 500 Å to about 2000 Å, such as from about 700 Å to about 1500 Å, from about 700 Å to about 1800 Å, from about 800 Å to about 1500 Å, from about 800 Å to about 1800 Å, or from about 800 Å to about 1800 Å. The conductive material 125' extends in a horizontal direction between the doped dielectric material 135 and the doped semiconductive material 120 and contacts the pillars 155. An oxidation act may be conducted to activate dopants in the conductive material 125' and so that the conductive material 125' is substantially continuous and includes few holes, voids, or a seam.

Figure 14:
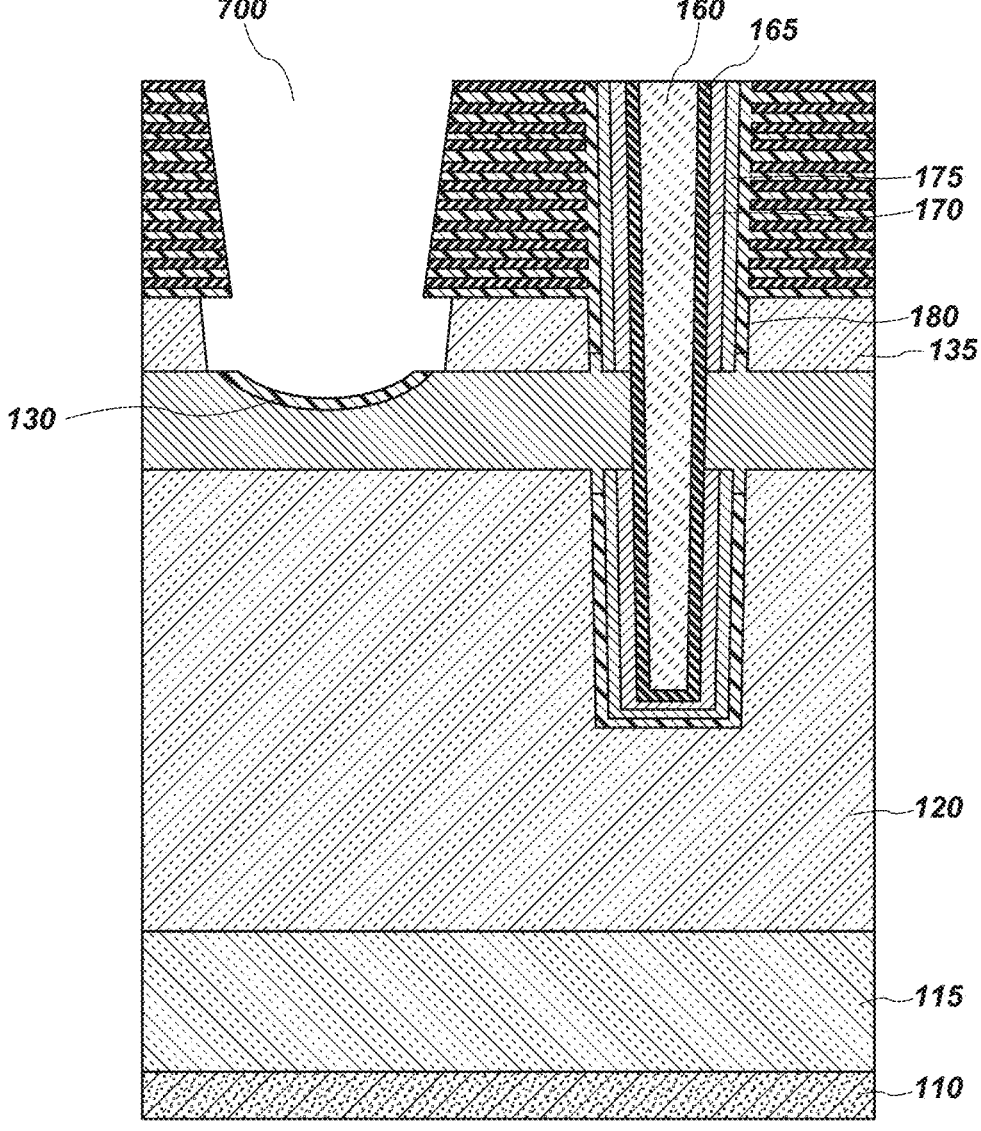

As shown in FIG. 14, the conductive material 125' is removed from the slit 700 while the conductive material 125' remains in the source contact opening 900''' and the recesses 1000, which forms the source contact 125. The conductive material 125' may be removed from the slit 700 without removing the conductive material 125' from the source contact opening 900'''. The conductive material 125' is removed by conventional techniques. The resulting source contact 125 extends in a horizontal direction between the doped dielectric material 135 and the doped semiconductive material 120 and contacts (e.g., directly contacts) the channel 165, the tunnel dielectric material 170, the charge trap material 175, and the charge blocking material 180 of the pillars 155. The source contact 125 directly contacts a lower surface of the doped dielectric material 135 and an upper surface of the doped semiconductive material 120. The source contact 125 also directly contacts upper and lower horizontal surfaces of the tunnel dielectric material 170, the charge trap material 175, and the charge blocking material 180 and sidewalls of the channel 165. The conductive material 125' present in the recesses 1000 increases a width of the source contact 125 proximal to the memory cells 190, providing an increased area of contact between the source contact 125 and the pillar 155. The source contact 125 is separated from the tiers 500 by the doped dielectric material 135. A portion of the source contact 125 exposed through the slit 700 may be removed, recessing the source contact 125 adjacent to (e.g., under) the slit 700, and oxidized by conventional techniques to form the oxidized portion 130 of the source contact 125.

The tunnel dielectric material 170, the charge trap material 175, and the charge blocking material 180 are not continuous over the entire height of the pillars 155 since the portions adjacent to (e.g., laterally adjacent to) the source contact 125 have been removed. Therefore, the portions of the tunnel dielectric material 170, the charge trap material 175, and the charge blocking material 180 below the source contact 125 are not connected to the portions above the source contact 125.

Subsequent process acts are then conducted to form the electronic device 100 as shown in FIGS. 1A and 1B. The subsequent process acts are conducted by conventional techniques. By way of example only, a replacement gate process is conducted to remove the nitride materials 505 of the tiers 500 and to form the conductive materials 150 of the tiers 140. The nitride materials 505 may be removed by exposing the tiers 500 to a wet etch chemistry formulated to remove, for example, silicon nitride. The wet etchant may include, but is not limited to, one or more of phosphoric acid, sulfuric acid, hydrochloric acid, nitric acid, or a combination thereof. In some embodiments, the nitride materials 505 of the tiers 500 are removed using a so-called "wet nitride strip" that includes phosphoric acid. While FIGS. 1A-14 illustrate the formation of the electronic device 100 by the replacement gate process, methods according to embodiments of the disclosure may be used to form the electronic device 100 by a floating gate process. One or more materials 195 may be formed in the slit 700, such as a single dielectric material, a combination of a dielectric material and silicon, or a combination of a dielectric material and a conductive material.

One or more electronic device 100 according to embodiments of the disclosure may be present in an apparatus or in an electronic system. The electronic device 100, the apparatus including the one or more electronic device 100, or the electronic system including the one or more electronic device 100 may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the electronic device 100 or after the electronic device 100 has been fabricated. By way of example only, one or more of the additional components may be formed before or after the cell films of the pillars 155 are formed, while other additional components may be formed after the electronic device 100 has been fabricated. The additional components may be present in locations of the electronic device 100 or the apparatus that are not depicted in the perspectives of FIGS. 1A-14.

During use and operation of the electronic device 100 according to embodiments of the disclosure, the doped dielectric material 135 provides an increased distance, corresponding to the height H 1 of the doped dielectric material 135, between the source contact 125 and the SGS 185. The electron flow through the channel 165 is also improved. In addition, by eliminating the cell films (the tunnel dielectric material 170, the charge trap material 175, the charge blocking material 180) in a conductive path between the channel 165 and the SGS 185, sources of charge trap within the conductive path are reduced or eliminated. The doped dielectric material 135 also provides a process margin during the fabrication of the electronic device 100. Therefore, electrical control of the electronic device 100 according to embodiments of the disclosure is improved relative to that of conventional electronic devices having a doped polysilicon material in a similar location, where interactions between a channel and memory cells of the conventional electronic devices occur.

Accordingly, disclosed is an electronic device comprising a source stack comprising one or more conductive materials, a source contact adjacent to the source stack, and a doped dielectric material adjacent to the source contact. Tiers of alternating conductive materials and dielectric materials are adjacent to the doped dielectric material and pillars extend through the tiers, the doped dielectric material, and the source contact and into the source stack.

Accordingly, disclosed is an electronic device comprising a source contact between a source stack and a dielectric material, the dielectric material comprising a doped dielectric material or a high-k dielectric material. Memory pillars extend through tiers adjacent to the dielectric material and into the source stack. The source contact directly contacts a channel of the memory pillars.

Accordingly, disclosed is a method of forming an electronic device. The method comprises forming a source contact sacrificial structure adjacent to a source stack, forming a doped dielectric material adjacent to the source contact sacrificial structure, and forming tiers adjacent to the doped dielectric material. Pillar openings are formed through the tiers and into the source stack, cell films are formed in the pillar openings, and the cell films comprise a channel. A slit is formed through the tiers to expose the source contact sacrificial structure. A first material of the source contact sacrificial structure is selectively removed to form a source contact opening, a portion of a charge blocking material of the cell films is removed to increase a size of the source contact opening. A portion of a charge trap material of the cell films and a portion of the doped dielectric material is removed to increase the size of the source contact opening. A portion of a tunnel dielectric material of the cell films is removed to further increase the size of the source contact opening and to expose the channel. A conductive material is formed in the source contact opening to form a source contact extending laterally and contacting the channel.

Figure 15:
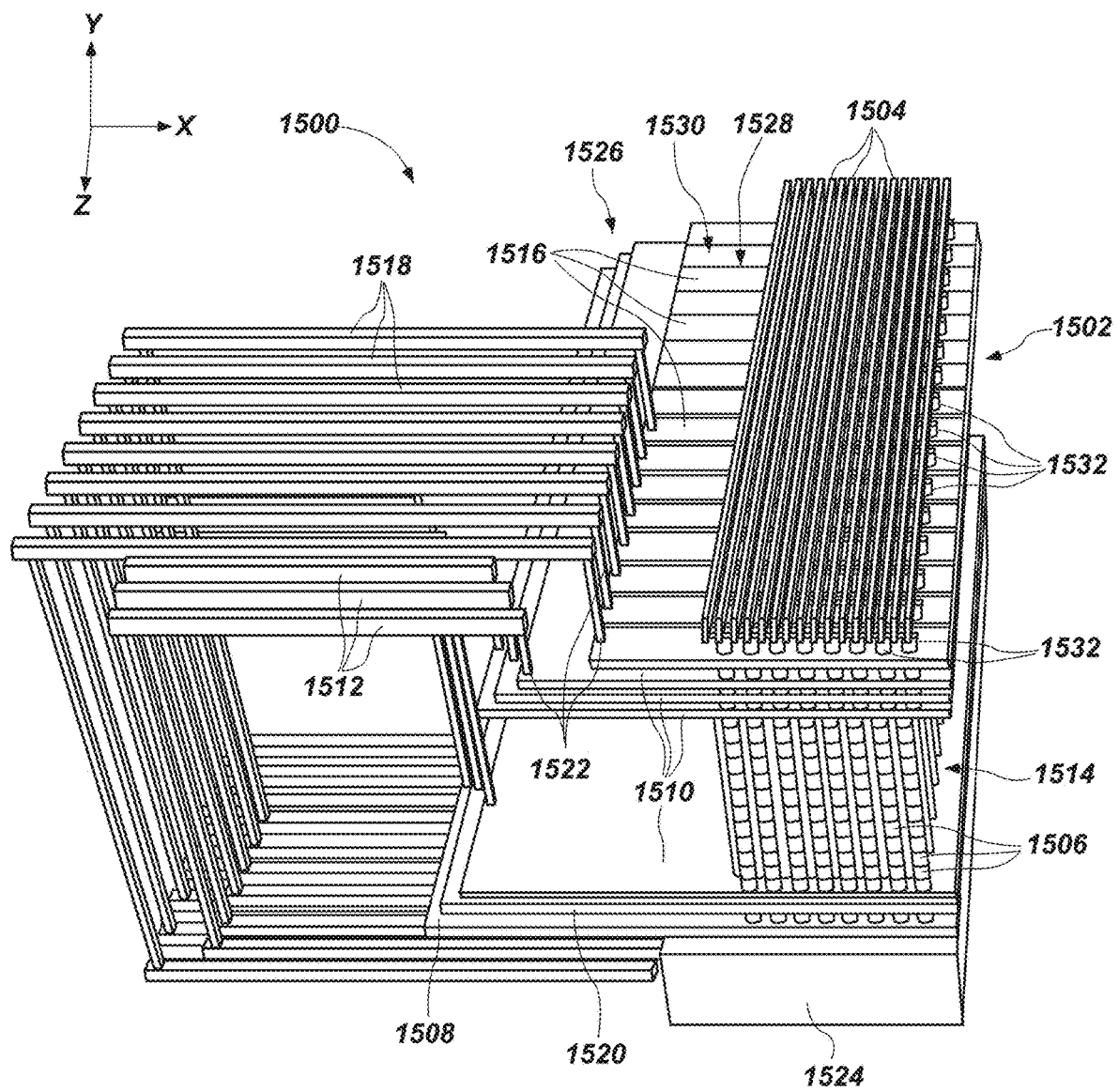
FIG. 15 is a partial, cutaway, perspective, schematic illustration of an apparatus including one or more electronic devices in accordance with embodiments of the disclosure.

With reference to FIG. 15 illustrated is a partial cutaway, perspective, schematic illustration of a portion of an apparatus 1500 (e.g., a memory device) including an electronic device 1502 according to embodiments of the disclosure. The electronic device 1502 may be substantially similar to the embodiments of the electronic device described above (e.g., the electronic device 100 of FIGS. 1A and 1B) and may have been formed by the methods described above. By way of example only, the memory device may be a 3D NAND Flash memory device, such as a multideck 3D NAND Flash memory device. As illustrated in FIG. 15, the electronic device 1502 may include a staircase structure 1526 defining contact regions for connecting access lines (e.g., word lines) 1512 to conductive tiers 1510 (e.g., conductive layers, conductive materials of tiers). The electronic device 1502 may include pillars 155 (see FIGS. 1A and 1B) with strings 1514 (e.g., strings of memory cells) that are coupled to each other in series. The pillars 155 with the strings 1514 may extend at least somewhat vertically (e.g., in the Z-direction) and orthogonally relative to the conductive tiers 1510, relative to data lines 1504, relative to a source tier 1508 (e.g., within one or more base materials under the source stack 105 (see FIGS. 1A and 1B)), relative to the access lines 1512, relative to first select gates 1516 (e.g., upper select gates, drain select gates (SGDs)), relative to select lines 1518, and/or relative to second select gates 1520 (e.g., SGS 185). The first select gates 1516 may be horizontally divided (e.g., in the X-direction) into multiple blocks 1530 by slits 1528.

Vertical conductive contacts 1522 may electrically couple components to each other, as illustrated. For example, the select lines 1518 may be electrically coupled to the first select gates 1516, and the access lines 1512 may be electrically coupled to the conductive tiers 1510. The apparatus 1500 may also include a control unit 1524 positioned under the memory array, which may include at least one of string driver circuitry, pass gates, circuitry for selecting gates, circuitry for selecting conductive lines (e.g., the data lines 1504, the access lines 1512), circuitry for amplifying signals, and circuitry for sensing signals. The control unit 1524 may be electrically coupled to the data lines 1504, the source tier 1508, the access lines 1512, the first select gates 1516, and/or the second select gates 1520, for example. In some embodiments, the control unit 1524 includes CMOS (complementary metal-oxide-semiconductor) circuitry. In such embodiments, the control unit 1524 may be characterized as having a so-called "CMOS under Array" (CuA) configuration.

The first select gates 1516 may extend horizontally in a first direction (e.g., the Y-direction) and may be coupled to respective first groups of strings 1514 of memory cells 1506 at a first end (e.g., an upper end) of the strings 1514. The second select gate 1520 may be formed in a substantially planar configuration and may be coupled to the strings 1514 at a second, opposite end (e.g., a lower end) of the strings 1514 of memory cells 1506.

The data lines 1504 (e.g., bit lines) may extend horizontally in a second direction (e.g., in the X-direction) that is at an angle (e.g., perpendicular) to the first direction in which the first select gates 1516 extend. The data lines 1504 may be coupled to respective second groups of the strings 1514 at the first end (e.g., the upper end) of the strings 1514. A first group of strings 1514 coupled to a respective first select gate 1516 may share a particular string 1514 with a second group of strings 1514 coupled to a respective data line 1504. Thus, a particular string 1514 may be selected at an intersection of a particular first select gate 1516 and a particular data line 1504. Accordingly, the first select gates 1516 may be used for selecting memory cells 1506 of the strings 1514 of memory cells 1506.

The conductive tiers 1510 (e.g., word lines, conductive liner materials 110 (e.g., FIGS. 1A and 1B)) may extend in respective horizontal planes. The conductive tiers 1510 may be stacked vertically, such that each conductive tier 1510 is coupled to all of the strings 1514 of memory cells 1506, and the strings 1514 of the memory cells 1506 extend vertically through the stack of conductive tiers 1510. The conductive tiers 1510 may be coupled to or may function as control gates of the memory cells 1506 to which the conductive tiers 1510 are coupled. Each conductive tier 1510 may be coupled to one memory cell 1506 of a particular string 1514 of memory cells 1506. The first select gates 1516 and the second select gates 1520 may operate to select a particular string 1514 of the memory cells 1506 between a particular data line 1504 and the source tier 1508. Thus, a particular memory cell 1506 may be selected and electrically coupled to a data line 1504 by operation of (e.g., by selecting) the appropriate first select gate 1516, second select gate 1520, and conductive tier 1510 that are coupled to the particular memory cell 1506.

The staircase structure 1526 may be configured to provide electrical connection between the access lines 1512 and the conductive materials of the tiers 1510 through the vertical conductive contacts 1522. In other words, a particular level of the conductive tiers 1510 may be selected via one of the access lines 1512 that is in electrical communication with a respective one of the vertical conductive contacts 1522 in electrical communication with the particular conductive tier 1510. The data lines 1504 may be electrically coupled to the strings 1514 through conductive structures 1532 (e.g., conductive contacts).

Figure 16:
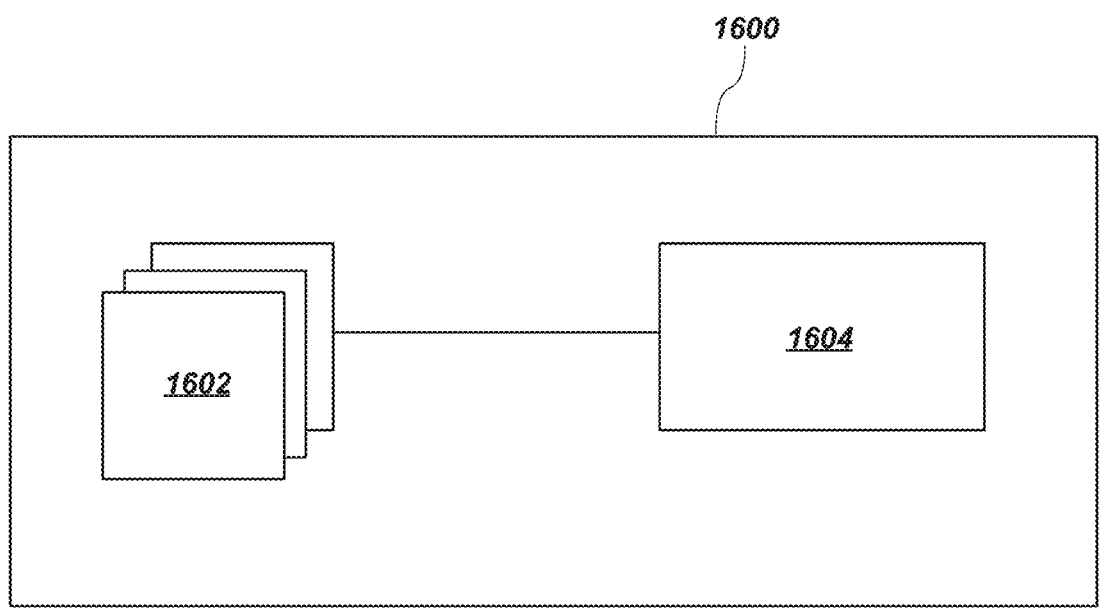
FIG. 16 is a block diagram of an electronic system including one or more electronic devices in accordance with embodiments of the disclosure.

The apparatus 1500 including the electronic devices 100 may be used in embodiments of electronic systems of the disclosure. FIG. 16 is a block diagram of an electronic system 1600, in accordance with embodiments of the disclosure. The electronic system 1600 includes, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 1600 includes at least one memory device 1602 that includes, for example, one or more electronic devices 100. The electronic system 1600 may further include at least one electronic signal processor device 1604 (e.g., a microprocessor). The electronic signal processor device 1604 may, optionally, include one or more electronic devices 100.

Figure 17:
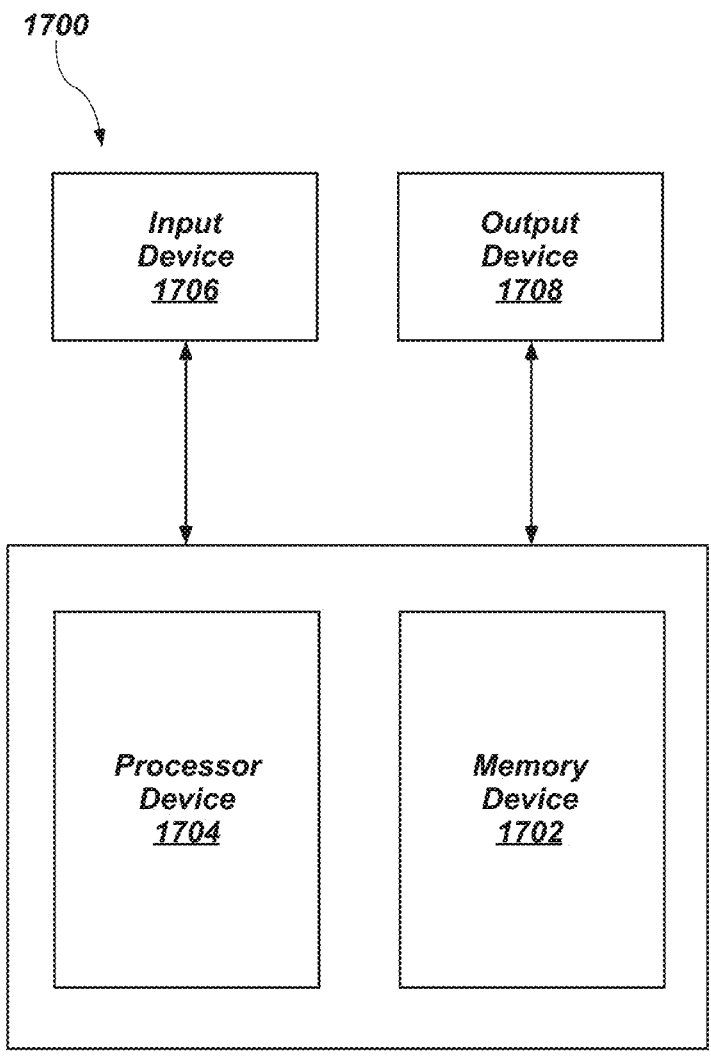
FIG. 17 is a block diagram of a processor-based system including one or more electronic devices in accordance with embodiments of the disclosure.

A processor-based system 1700 (e.g., an electronic processor-based system 1700), shown in FIG. 17, includes one or more input devices 1706 for inputting information into the processor-based system 1700 by a user, such as, for example, a mouse or other pointing device, a keyboard, a touchpad, a button, or a control panel. The processor-based system 1700 may further include one or more output devices 1708 for outputting information (e.g., visual or audio output) to a user such as, for example, a monitor, a display, a printer, an audio output jack, a speaker, etc. In some embodiments, the input device 1706 and the output device 1708 may comprise a single touchscreen device that can be used both to input information into the processor-based system 1700 and to output visual information to a user. The input device 1706 and the output device 1708 may communicate electrically with one or more of the memory device 1702 and the electronic signal processor device 1704. The memory device 1702 and the electronic signal processor device 1704 may include one or more of the electronic devices 100.

Accordingly, disclosed is an electronic system comprising a processor device operably coupled to an input device and to an output device. One or more memory devices are operably coupled to the processor device and comprise one or more electronic devices. The electronic devices comprise a source contact adjacent to a source stack and a dielectric material adjacent to the source contact. The dielectric material comprises a doped dielectric material or a high-k dielectric material. Tiers of alternating conductive materials and dielectric materials are adjacent to the dielectric material and memory pillars extend through the tiers, the dielectric material, and the source contact. The memory pillars extend partially into the source stack.

Figure 18:
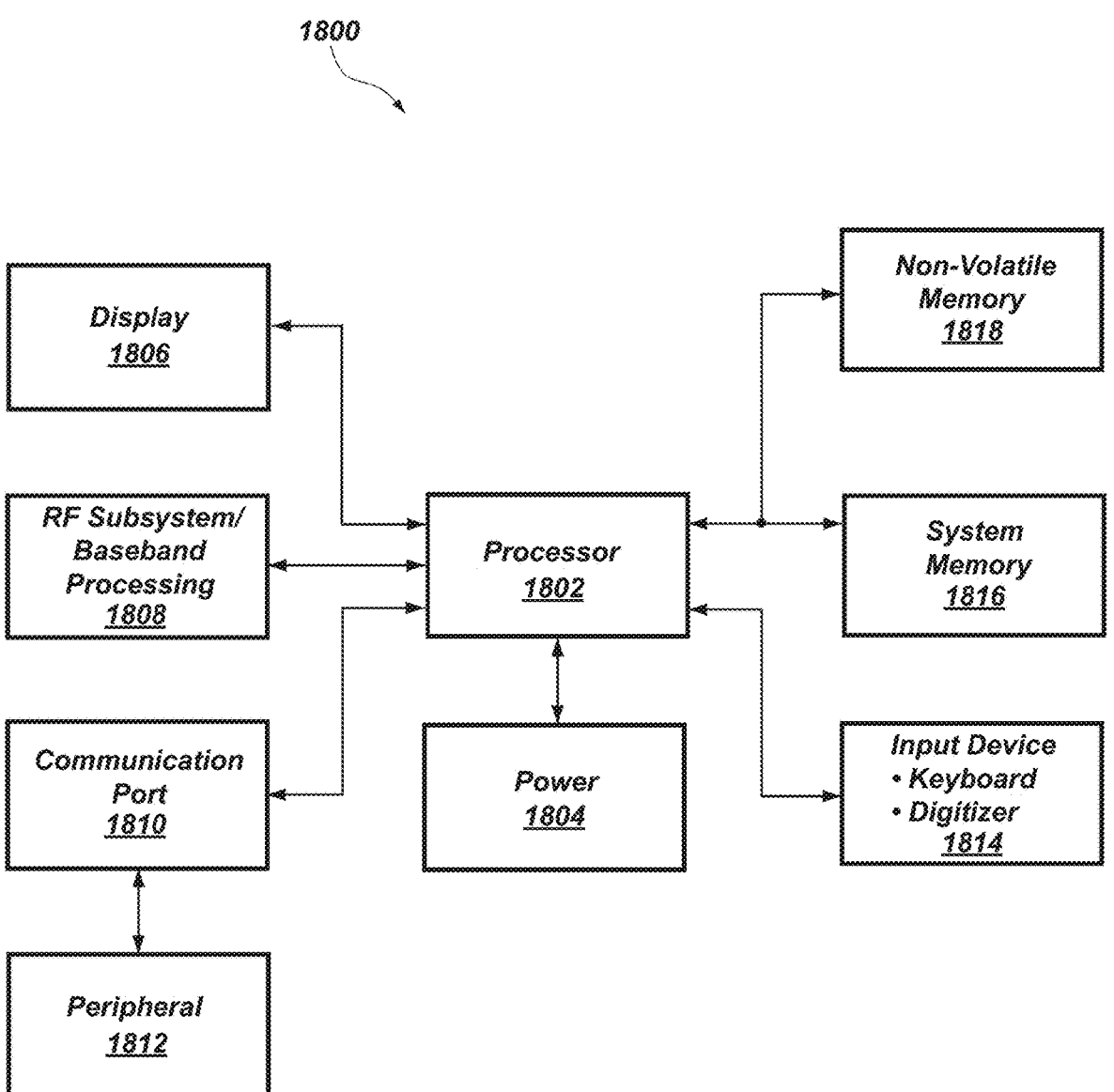
FIG. 18 is a block diagram of an additional processor-based system including one or more electronic devices in accordance with embodiments of the disclosure.

With reference to FIG. 18, shown is a block diagram of an additional processor-based system 1800 (e.g., an electronic processor-based system 1800). The processor-based system 1800 may include various electronic devices 100 and apparatus 1500 manufactured in accordance with embodiments of the disclosure. The processor-based system 1800 may be any of a variety of types, such as a computer, a pager, a cellular phone, a personal organizer, a control circuit, or another electronic device. The processor-based system 1800 may include one or more processors 1802, such as a microprocessor, to control the processing of system functions and requests in the processor-based system 1800. The processor 1802 and other subcomponents of the processor-based system 1800 may include electronic devices 100 and apparatus 1500 manufactured in accordance with embodiments of the disclosure.

The processor-based system 1800 may include a power supply 1804 in operable communication with the processor 1802. For example, if the processor-based system 1800 is a portable system, the power supply 1804 may include one or more of a fuel cell, a power scavenging device, permanent batteries, replaceable batteries, and/or rechargeable batteries. The power supply 1804 may also include an AC adapter if, for example, the processor-based system 1800 may be plugged into a wall outlet. The power supply 1804 may also include a DC adapter such that the processor-based system 1800 may be plugged into a vehicle cigarette lighter or a vehicle power port, for example.

Various other devices may be coupled to the processor 1802 depending on the functions that the processor-based system 1800 performs. For example, a user interface may be coupled to the processor 1802. The user interface may include one or more input devices 1814, such as buttons, switches, a keyboard, a light pen, a mouse, a digitizer and stylus, a touch screen, a voice recognition system, a microphone, or a combination thereof. A display 1806 may also be coupled to the processor 1802. The display 1806 may include an LCD display, an SED display, a CRT display, a DLP display, a plasma display, an OLED display, an LED display, a three-dimensional projection, an audio display, or a combination thereof. Furthermore, an RF subsystem/baseband processor 1808 may also be coupled to the processor 1802. The RF subsystem/baseband processor 1808 may include an antenna that is coupled to an RF receiver and to an RF transmitter. A communication port 1810, or more than one communication port 1810, may also be coupled to the processor 1802. The communication port 1810 may be adapted to be coupled to one or more peripheral devices 1812 (e.g., a modem, a printer, a computer, a scanner, a camera) and/or to a network (e.g., a local area network (LAN), a remote area network, an intranet, or the Internet).

The processor 1802 may control the processor-based system 1800 by implementing software programs stored in the memory (e.g., system memory 1816). The software programs may include an operating system, database software, drafting software, word processing software, media editing software, and/or media-playing software, for example. The memory is operably coupled to the processor 1802 to store and facilitate execution of various programs. For example, the processor 1802 may be coupled to system memory 1816, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 1816 may include volatile memory, nonvolatile memory, or a combination thereof. The system memory 1816 is typically large so it can store dynamically loaded applications and data. The system memory 1816 may include one or more apparatus 1500 and one or more electronic devices 100 according to embodiments of the disclosure.

The processor 1802 may also be coupled to nonvolatile memory 1818, which is not to suggest that system memory 1816 is necessarily volatile. The nonvolatile memory 1818 may include one or more of STT-MRAM, MRAM, read-only memory (ROM) (e.g., EPROM, resistive read-only memory (RROM)), and Flash memory to be used in conjunction with the system memory 1816. The size of the nonvolatile memory 1818 is typically selected to be just large enough to store any necessary operating system, application programs, and fixed data. Additionally, the nonvolatile memory 1818 may include a high-capacity memory (e.g., disk drive memory, such as a hybrid-drive including resistive memory or other types of nonvolatile solid-state memory, for example). The nonvolatile memory 1818 may include one or more apparatus 1500 and one or more electronic devices 100 according to embodiments of the disclosure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a source contact between a source stack and a dielectric material, the dielectric material comprising a doped dielectric material or a high-k dielectric material; and
memory pillars extending through tiers adjacent to the dielectric material and into the source stack, the source contact directly contacting a channel of the memory pillars, the channel extending continuously along a height of the memory pillars and one or more of a tunnel dielectric material, a charge trap material, and a charge blocking material extending along a portion of the height of the memory pillars.

2. The electronic device of claim 1, wherein the doped dielectric material or the high-k dielectric material is formulated to be selectively etchable relative to one or more materials of the memory pillars.

3. The electronic device of claim 1, wherein a portion of the tunnel dielectric material, the charge trap material, and the charge blocking material of the memory pillars is above the source contact and an additional portion of the tunnel dielectric material, the charge trap material, and the charge blocking material of the memory pillars is below the source contact.

4. The electronic device of claim 3, wherein a lower surface of the charge trap material above the source contact is recessed relative to a lower surface of the tunnel dielectric material above the source contact.

5. The electronic device of claim 1, wherein the channel of the memory pillars extends through the source contact.

6. An electronic device, comprising:
a doped dielectric material or a high-k dielectric material between a source contact and tiers, the source contact overlying a source stack; and
memory pillars extending from the tiers to the source stack, a length of a charge blocking material of the memory pillars being relatively shorter than a length of one or more additional materials of the memory pillars.

7. The electronic device of claim 6, wherein the length of the charge blocking material is less than a length of a charge trap material of the memory pillars.

8. The electronic device of claim 6, wherein a length of a charge trap material of the memory pillars is greater than a length of one or more of a tunnel dielectric material and a charge blocking material of the memory pillars.

9. The electronic device of claim 6, wherein a width of the source contact vertically adjacent to the charge blocking material is greater than a width of the source contact vertically adjacent to the doped dielectric material or the high-k dielectric material.

10. The electronic device of claim 6, wherein the tiers comprise alternating conductive materials and dielectric materials and one or more tiers proximal to the doped dielectric material or the high-k dielectric material is configured as a select gate source.

11. An electronic device, comprising:
a dielectric material between a source contact and tiers overlying a source stack; and
memory pillars comprising a channel, a tunnel dielectric material, a charge trap material, and a charge blocking material in an active region of the electronic device, the memory pillars extending through the tiers and into the source stack, the source contact extending horizontally over the source stack and directly contacting the channel of the memory pillars, the channel extending continuously along the memory pillars, a portion of one or more of the tunnel dielectric material, the charge trap material, and the charge blocking material above the source contact, and an additional portion of the one or more of the tunnel dielectric material, the charge trap material, and the charge blocking material below the source contact.

12. The electronic device of claim 11, wherein the portion of the one or more of the tunnel dielectric material, the charge trap material, and the charge blocking material above the source contact and the additional portion of the one or more of the tunnel dielectric material, the charge trap material, and the charge blocking material below the source contact are separated by the source contact.

13. The electronic device of claim 11, wherein the dielectric material between the source contact and the tiers comprises a doped dielectric material or a high-k dielectric material.

14. The electronic device of claim 11, wherein the dielectric material between the source contact and the tiers comprises a high-k oxide material, a high-k metal oxide material, or a combination thereof.

15. The electronic device of claim 11, wherein the dielectric material between the source contact and the tiers comprises doped silicon nitride or doped silicon oxide.

16. The electronic device of claim 15, wherein the dielectric material comprises carbon doped silicon nitride, carbon doped silicon oxide, boron doped silicon nitride, or boron doped silicon oxide.

17. The electronic device of claim 11, further comprising a source contact sacrificial structure in peripheral regions of the electronic device.

18. The electronic device of claim 17, wherein the source contact sacrificial structure is between the dielectric material and the source stack.

19. The electronic device of claim 17, wherein the source contact sacrificial structure in the peripheral regions and the source contact in the active region exhibit a same thickness.

20. The electronic device of claim 11, wherein the channel comprises polysilicon and the source contact comprises doped polysilicon.

* * * * *